(12) United States Patent
Kato et al.

(10) Patent No.: US 7,560,321 B2
(45) Date of Patent: Jul. 14, 2009

(54) CRYSTALLIZATION METHOD, THIN FILM TRANSISTOR MANUFACTURING METHOD, THIN FILM TRANSISTOR, DISPLAY, AND SEMICONDUCTOR DEVICE

(75) Inventors: Tomoya Kato, Yokohama (JP); Masakiyo Matsumura, Kamakura (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 0 days.

(21) Appl. No.: 11/687,374

(22) Filed: Mar. 16, 2007

(65) Prior Publication Data
US 2007/0215877 A1    Sep. 20, 2007

(30) Foreign Application Priority Data
Mar. 17, 2006    (JP) .............................. 2006-074384

(51) Int. Cl.
*H01L 21/00* (2006.01)
(52) U.S. Cl. ............... 438/166; 438/486; 257/E21.134; 257/E21.413
(58) Field of Classification Search ................ 438/149, 438/150, 166, 168, 486; 257/E21.134, E21.413
See application file for complete search history.

(56) References Cited
U.S. PATENT DOCUMENTS
7,118,946 B2    10/2006    Hiramatsu et al.

2004/0266080 A1*    12/2004    Jyumonji et al. ............ 438/166

FOREIGN PATENT DOCUMENTS
WO    WO 03/081676 A1    10/2003

OTHER PUBLICATIONS

Masakiyo Matsumura, "Preparation of Ultra-Large Grain Silicon Thin-Films by Excimer-Laser". Journal of the Surface Science Society of Japan, vol. 21, No. 5, May 2000, pp. 278-287 and two cover pages (With English Abstract).

* cited by examiner

*Primary Examiner*—W. David Coleman
*Assistant Examiner*—Shaka Scarlett
(74) *Attorney, Agent, or Firm*—Oblon, Spivak, McClelland, Maier & Neustadt, P.C.

(57) ABSTRACT

According to a crystallization method, in the crystallization by irradiating a non-single semiconductor thin film of 40 to 100 nm provided on an insulation substrate with a laser light, a light intensity distribution having an inverse peak pattern is formed on the surface of the substrate, a light intensity gradient of the light intensity distribution is controlled, a crystal grain array is formed in which each crystal grain is aligned having a longer shape in a crystal growth direction than in a width direction and having a preferential crystal orientation (100) in a grain length direction, and a TFT is formed in which a source region and a drain region are formed so that current flows across a plurality of crystal grains of the crystal grain array in the crystal growth direction.

5 Claims, 14 Drawing Sheets

T: Period off light intensity distribution
G: Light intensity gradient

| Item | Crystal growth direction in lateral direction <110> group | | |
|---|---|---|---|
| Lattices orientation | <001> / <110> S→D | <110> / <110> S→D | <111> / <110> S→D |
| Current direction | | | |
| μFE [cm²/Vs] | 685-500 | 450-300 | 300-230 Mobility |

| Item | Crystal growth direction in lateral direction <110> group | | Lateral Growth direction |
|---|---|---|---|
| Lattices orientation | <001> / <100> S→D | <110> / <100> S→D | Source(S) Drain(D) ↻ : surface orientation |
| Current direction | | | |
| μFE [cm²/Vs] | 500 | 346 Mobility | |

FIG. 14

CRYSTALLIZATION METHOD, THIN FILM TRANSISTOR MANUFACTURING METHOD, THIN FILM TRANSISTOR, DISPLAY, AND SEMICONDUCTOR DEVICE

CROSS-REFERENCE TO RELATED APPLICATIONS

This application is based upon and claims the benefit of priority from prior Japanese Patent Application No. 2006-074384, filed Mar. 17, 2006, the entire contents of which are incorporated herein by reference.

BACKGROUND OF THE INVENTION

1. Field of the Invention

The present invention relates to a crystallization method, a method of manufacturing a thin film transistor, a thin film transistor, a display, and a semiconductor device.

2. Description of the Related Art

Because a thin film transistor (referred to as TFT) can be formed on surfaces of various materials, a circuit for display can be directly formed, for example, on an inner wall surface of a display panel within a display. An early TFT directly forms a channel region on an amorphous silicon film on a substrate. A current TFT forms a channel region on a polycrystalline silicon film with an amorphous silicon film crystallized. In the current TFT, carrier mobility is ten times faster than that of the early TFT.

On the above polycrystalline silicon film, crystals with the grain size of about 0.1 μm are scattered irregularly. In the TFT with a channel region formed on the polycrystalline silicon film, the channel region includes a lot of crystal grain boundaries, which results in unevenness in properties. The crystal grain boundary presents resistance to an electron moving within the channel region or a hole.

The inventors aim to obtain the same transistor property as that of a transistor formed on a silicon wafer, propose a crystallization method for forming an array of large crystal grains enough to form one or a plurality of TFTs within one crystal grain, in Surface Science Vol. 21, No. 5, P. 278-287 (2000) (Non-Patent Document 1), and develop its industrialization technique. Forming a TFT within one crystal grain has less ill effect on the transistor property caused by the grain boundaries and improves the TFT property dramatically, unlike the conventional transistor in which a grain boundary is formed within a channel region.

A driving circuit of a display such as a liquid crystal display has been formed so far separately from the amorphous semiconductor film formed on a glass substrate that is a display panel. With an increase in the IT market, information to be handled is digitalized and speeded up, together with a requirement for higher image quality in a display. As means for satisfying the above requirement for higher image quality, a switching transistor which switches each pixel is formed on the crystal semiconductor. Therefore, switching speed gets faster with higher image quality.

In the display, there are a signal processor such as a DA converter which converts digital image data into analog image signal and a gate array which processes digital image data, and a driving circuit such as a signal line drive circuit and a scanning line drive circuit, in addition to a pixel switching circuit. There is a demand to integrate these circuits onto the same display panel substrate together with the pixel switching circuit. In order to satisfy the demand, it is necessary to develop a TFT with higher carrier mobility and less unevenness in the mobility and threshold voltage property.

SUMMARY OF THE INVENTION

The object of the invention is to provide a crystallization method, a method of manufacturing a thin film transistor, a thin film transistor, and a display capable of obtaining a TFT with high mobility and less unevenness in the mobility and the threshold voltage property.

A crystallization method according to the present invention comprises: (i) directly or indirectly forming a non-single crystal semiconductor thin film on a substrate; (ii) forming an insulating film on the non-single crystal semiconductor thin film; (iii) irradiating the substrate with a laser light having a light intensity distribution of a plurality of inverse peak patterns continuous on an irradiation region of the insulating film; (iv) forming a crystal grain array, in which each crystal grain crystallized in a longer shape in a crystal growth direction than in a width direction is aligned adjacently in the width direction, on the non-single crystal semiconductor thin film; and (v) changing a period T of the light intensity distribution and controlling a light intensity gradient G.

A crystallization method according to the present invention comprises: (a) directly or indirectly forming a non-single crystal semiconductor thin film on a substrate; (b) forming an insulating film on the non-single crystal semiconductor thin film; (c) irradiating the substrate with a laser light under such a condition that a light intensity distribution of the laser light has a plurality of inverse peak patterns continuous on an irradiation surface of the insulating film and, when a relative light intensity of the maximum value in the light intensity distribution of the laser light is defined as 1, a light intensity gradient G is selected in the range of $0.02\ \mu m^{-1}$ to $0.25\ \mu m^{-1}$; and (d) forming a crystal grain array, in which each crystal grain crystallized in a longer shape in a crystal growth direction than in a width direction is aligned adjacently in the width direction, on the non-single crystal semiconductor thin film.

A crystallization method according to the present invention is characterized in that, when the relative light intensity of the maximum value in the light intensity distribution is 1, the relative light intensity of the minimum value is in the range of 0.4 to 0.8.

A crystallization method according to the present invention is characterized in that a period T of the light intensity distribution is in the range of 4 μm to 80 μm.

A method of manufacturing a thin film transistor according to the present invention comprises: (a) directly or indirectly forming a non-single crystal semiconductor thin film on a substrate; (b) forming an insulating film on the non-single crystal semiconductor thin film; (c) irradiating the substrate with a laser light under such a condition that a light intensity distribution of the laser light has a plurality of inverse peak patterns continuous on an irradiation surface of the insulating film and, when a relative light intensity of the maximum value in the light intensity distribution of the laser light is defined as 1, a light intensity gradient G is selected in the range of $0.02\ \mu m^{-1}$ to $0.25\ \mu m^{-1}$; (d) forming a crystal grain array, in which each crystal grain crystallized in a longer shape in a crystal growth direction than in a width direction is aligned adjacently in the width direction, on the non-single crystal semiconductor thin film, and (e) forming a thin film transistor so that current flows in the crystal growth direction of the crystal grains.

A thin film transistor of the present invention has a thin film transistor formed so that current flows in the crystal growth direction of the crystal grains manufactured according to the above method.

A display according to the present invention comprises: the crystal grains manufactured according to the above method, which are previously formed at a predetermined position to form a pixel switching transistor; and a thin film transistor for the pixel switching transistor which is formed so that current flows in the crystal growth direction of the crystal grains.

A crystallization method according to the present invention comprises: (a) directly or indirectly forming a non-single crystal semiconductor thin film on a substrate and selecting a film thickness of the non-single crystal semiconductor thin film in the range of 40 nm to 70 nm; (b) forming a light absorptive insulating film which absorbs part of a laser light for crystallization on the non-single crystal semiconductor thin film; (c) irradiating the substrate with a laser light to crystallize an irradiation region of the non-single crystal semiconductor thin film, under such a condition that a light intensity distribution of the laser light has a plurality of inverse peak patterns continuous on an irradiation surface of the insulating film and, when a relative light intensity of the maximum value in the light intensity distribution of the laser light is defined as 1, a light intensity gradient G is selected in the range of 0.02 $\mu m^{-1}$ to 0.04 $\mu m^{-1}$; and (d) preferentially determining at (100) a surface orientation in a crystal growth direction on the irradiation region of the non-single crystal semiconductor thin film.

A thin film transistor according to the present invention comprises: a substrate; a non-single crystal semiconductor thin film directly or indirectly formed on the substrate; a crystal grain which is grown in a lateral direction from a crystal seed provided on the semiconductor thin film and crystallized in a longer shape in a crystal growth direction than in a width direction; a crystal grain array in which the crystal grains are aligned adjacently in the width direction; and a source region and a drain region formed so that current flows across a plurality of the crystal grains of the crystal grain array in a crystal growth direction, wherein a crystal surface in the current flowing direction is preferentially determined at (100) in a channel region provided between the source region and the drain region.

A semiconductor device according to the present invention comprises: a substrate; a non-single crystal semiconductor thin film directly or indirectly formed on the substrate; and a crystal grain array of crystallized grains grown from crystal seeds provided on the semiconductor thin film in a lateral direction, wherein in the crystal grain array, each grain in a longer shape in a crystal growth direction than in a width direction is adjacently aligned in the width direction and a surface orientation in the crystal growth direction is preferentially determined at (100).

A semiconductor device according to the present invention is characterized in that the crystal grain has a grain length in the range of 2 $\mu m$ to 15 $\mu m$ and an average grain width in the range of 0.2 $\mu m$ to 0.8 $\mu m$.

A display according to the present invention comprises: a substrate; a non-single crystal semiconductor thin film directly or indirectly formed on the substrate; a crystal grain which is grown in a lateral direction from a crystal seed provided on a predetermined pixel switching circuit in the non-single crystal semiconductor thin film and crystallized in a longer shape in a crystal growth direction than in a width direction; a crystal grain array in which the crystal grains are aligned adjacently in the width direction and a crystal orientation in the growth direction is preferential determined at (100); and a thin film transistor including a source region and a drain region which are formed so that current flows across a plurality of the crystal grains of the crystal grain array in the crystal growth direction.

BRIEF DESCRIPTION OF THE SEVERAL VIEWS OF THE DRAWING

FIG. 14 is a schematic view showing in a table, a relation between a crystal surface in a crystallization region in which a channel region of the TFT is formed and the mobility of the TFT.

DETAILED DESCRIPTION OF THE INVENTION

Figure 1:
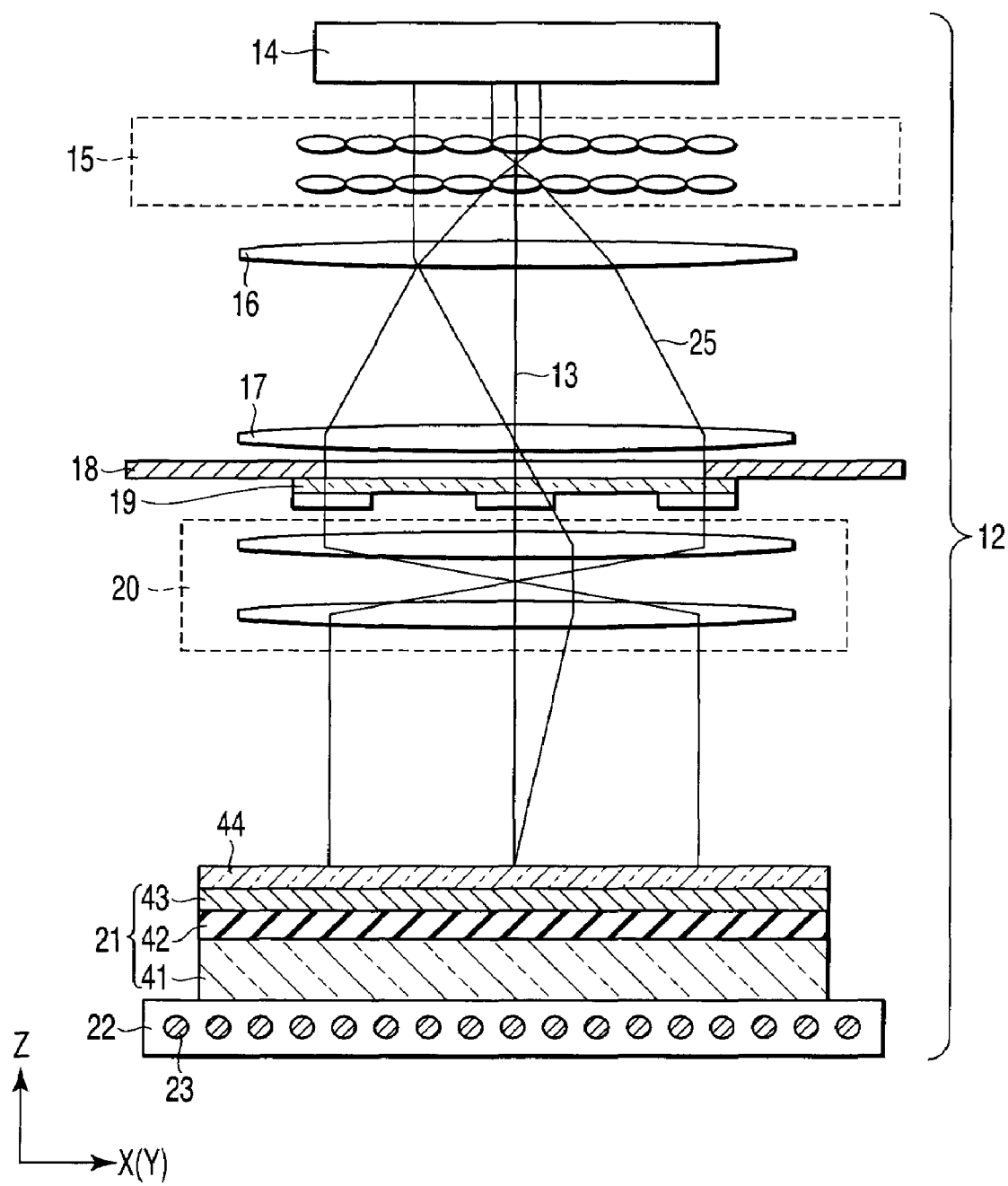
FIG. 1 is a structural block diagram schematically showing a crystallization device used for the crystallization method of the invention.

Embodiments of the present invention will be described specifically. In a crystallization method according to a first embodiment, a non-single crystal semiconductor thin film directly or indirectly formed on a substrate is irradiated with a laser light having a light intensity distribution of inverse peak pattern. In order to form a crystallized grain array in which crystal grains crystallized longer in a crystal growth direction than in a width direction are arranged adjacently in the width direction, the period of the light intensity distribution of the inverse peak pattern is changed to control the light intensity gradient hence to control the laterally growing distance of the crystal grains. In the method of this embodiment, the light intensity gradient is selected in the range of 0.02 $\mu m^{-1}$ to 0.25 $\mu m^{-1}$ when the relative light intensity of the maximum value is defined as 1 in the light intensity distribution of the inverse peak pattern.

In a crystallization method according to a second embodiment, when the relative light intensity of the maximum value is defined as 1 (reference value) in the light intensity distribution having the inverse peak pattern, as in the same optical system as in the crystallization method of the first embodiment, a non-single crystal semiconductor thin film with a film thickness of 40 nm to 70 nm is irradiated with a laser light for crystallization with the intensity gradient set in the range of 0.02 $\mu m^{-1}$ to 0.04 $\mu m^{-1}$, thereby preferentially adjusting the surface orientation in the crystal growth direction in a region to be irradiated at (100).

At first, the crystallization method capable of forming a thin film transistor having a property of less unevenness by selecting a light intensity gradient in the light intensity distribution according to the first embodiment will be described referring to FIGS. 1 to 8. In the drawings, the same reference numerals are attached to the same parts and the description thereof is omitted.

EMBODIMENT 1

Figure 2A:
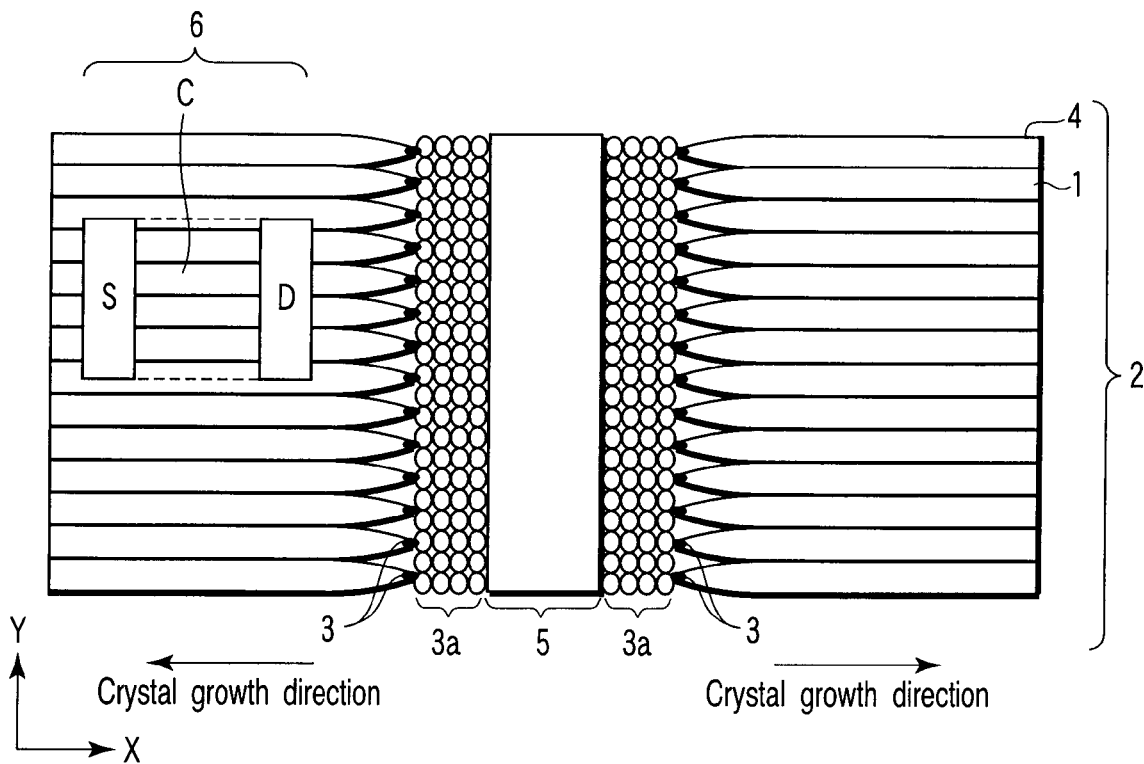
FIG. 2A is a schematic plan view showing crystallized grain array formed by the crystallization device shown in FIG. 1.

A manufacturing device (crystallization device) of the crystallized grain array used for describing the crystallization method will be described referring to FIG. 1. FIG. 1 shows an example of a crystallization device which manufactures a crystallized grain array 2 in which long and slender crystal grains 1 are arranged in a width direction according to the PMELA method, as shown in FIG. 2A. The manufacturing device in this embodiment is a laser annealer 11 using a laser light as an energy beam.

The laser annealer 11 has an optical system 12 of projection type. The optical system 12 includes an XeCl excimer laser oscillator 14, a homogenizer 15, a first condenser lens 16, a second condenser lens 17, a mask 18, a phase shifter 19, and a telecentric reducing lens 20, along a laser light axis 13. An XYZθ stage 22 is arranged at an image focus location of the telecentric reducing lens 20, so as to position a substrate 21 to be processed properly. A heater 23 is included in the XYZθ stage 22 so as to heat the substrate 21 depending on necessity during the crystallization. The laser annealer 11 is thus formed.

Figure 3A:
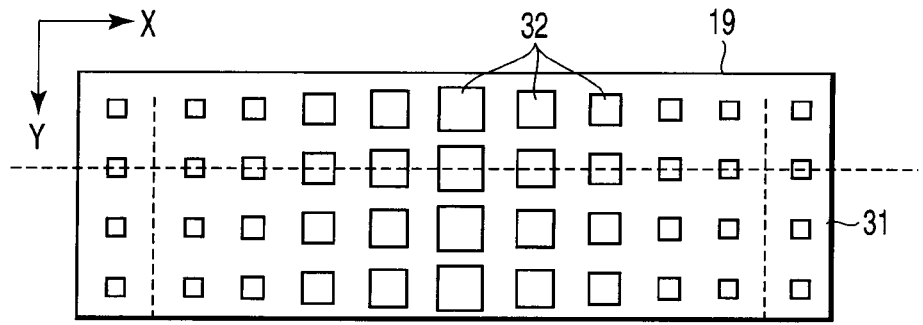
FIG. 3A is a schematic plan view of a phase shifter.

The phase shifter 19 is, for example, an area modulation typed phase shifter, as illustrated in FIG. 3A, which is interposed between the mask 18 and the reducing lens 20. The phase shifter 19 phase-modulates a laser light of the incident light whose light intensity distribution is uniformized by the homogenizer 15 and forms a V-shaped light intensity distribution as shown in FIG. 3D, that is, the light intensity distribution having the inverse peak pattern of the minimum light intensity, in a cross section of the laser light. The phase shifter 19 is an optical element for diffracting the incident light at a step which is formed on the light-transmitting substrate.

Figure 3B:
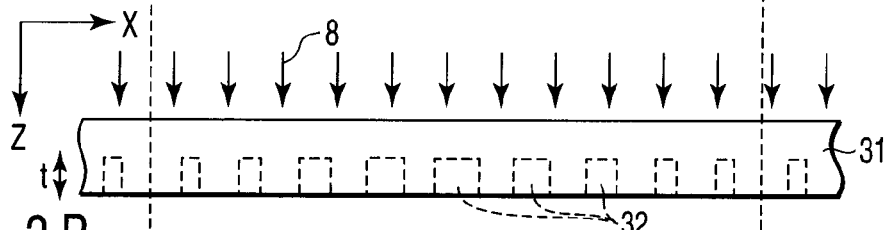
FIG. 3B is a schematic lateral side view of the phase shifter.

For example, as illustrated in FIGS. 3A and 3B, the phase shifter 19 has a groove 32 pattern formed by etching a quartz material 31 with a mask of pattern shown in FIG. 3A. In other words, the phase shifter 19 in FIG. 3A is a mask for area-modulating the repetitive pattern of periodical dotted steps of various measurements (areas). The dotted step means such a portion that a dot is a step formed by the etched groove 32.

The phase shifter 19 in this embodiment has an array of the dotted step of continuously various measurements (areas), to form the light intensity distribution of the period T, the minimum value B (0.4-0.8), and the light intensity gradient G, as illustrated in FIG. 3D. The groove 32 of the phase shifter 19 is processed into a step of 154 nm in order to get a phase difference of, for example, 90° when the wavelength of the laser light from the laser oscillator 14 is 308 nm.

The period T in the light intensity distribution shown in FIG. 3D can be controlled by changing the periodical arrangement of the dotted pattern shown in FIG. 3A. The minimum value B of the laser light strength shown in FIG. 3D can be controlled by changing the depth of the dotted step. The light intensity gradient G is determined by the period T and the minimum value B.

The period T in the light intensity distribution is preferably in the range of 4 μm to 80 μm. When the period T is less than 4 μm, the range of the crystal grain which laterally grows is short, in other words, the grain length becomes short. On the other hand, when the period T exceeds 80 μm, the light intensity gradient G becomes too soft and the area ratio in the laterally growing region in the laser irradiation region becomes small. The suitable period T is determined by the type of a cap film, the film thickness of a semiconductor layer, and the like. The preferable period T is in the range of 8 μm to 30 μm and more preferably it is in the range of 10 μm to 20 μm.

The relative intensity of the minimum value B in the light intensity distribution is preferably in the range of 0.4 to 0.8. When the relative intensity of the minimum value B is less than 0.4, the area ratio of the region other than the laterally growing region, such as an amorphous region and a microcrystalline region, increases within the laser irradiation region. On the other hand, when the relative intensity of the minimum value B becomes more than 0.8, the light intensity gradient G becomes too soft to get a driving force in the lateral growth direction owing to the temperature gradient. A proper relative intensity of the minimum value B in the light intensity distribution is determined by the type of a cap film described later and the film thickness of a film to be crystallized. A preferable relative intensity of the minimum value B in the light intensity distribution is in the range of 0.5 to 0.7.

The light intensity gradient G is defined in the range of 0.02 $\mu m^{-1}$ to 0.25 $\mu m^{-1}$. When the light intensity gradient G becomes less than 0.02 $\mu m^{-1}$, the temperature gradient becomes too soft to get a driving force enough for lateral growth. On the other hand, when the light intensity gradient G exceeds 0.25 $\mu m^{-1}$, the laterally growing range becomes smaller, and as the result, the grain length becomes shorter. A suitable light intensity gradient G is determined by the desired crystal shape and orientation of the crystallization semiconductor layer, the type of a cap film, and the film thickness of the semiconductor layer.

When the crystal orientation in the crystal growth direction (longitudinal direction) is preferentially determined at (100) in the film structure using a light absorptive cap film, the light intensity gradient G is set in the range of 0.02 $\mu m^{-1}$ to 0.04 $\mu m^{-1}$. When the light intensity gradient G becomes less than 0.02 $\mu m^{-1}$, the temperature gradient becomes too soft to get a driving force enough for lateral growth. On the other hand, when the light intensity gradient G exceeds 0.04 $\mu m^{-1}$, the growing speed of the crystal grain decreases as mentioned below and the orientation ratio of (100) in the surface orientation in the crystal growth direction becomes less. A preferable light intensity gradient G is in the range of 0.030 $\mu m^{-1}$ to 0.035 $\mu m^{-1}$.

When the crystal orientation in the crystal growth direction (longitudinal direction) is preferentially determined at (100) in the film structure using a translucent cap film, the temperature gradient becomes too soft to get a driving force enough for lateral growth when the light intensity gradient G becomes less than 0.05 $\mu m^{-1}$. On the other hand, when the light intensity gradient G is more than 0.25 $\mu m^{-1}$, the range of lateral growth becomes shorter and as the result, the grain length becomes shorter. The light intensity gradient G is preferably in the range of 0.10 $\mu m^{-1}$ to 0.25 $\mu m^{-1}$.

This time, a mode for carrying out the crystallization process by this laser annealer 11 will be described. A translucent insulation substrate (for example, glass substrate) on which various semiconductor films are formed is used as the substrate 21 to be mounted on the XYZθ stage 22. A base insulating film 42, an amorphous semiconductor layer 43, and a cap film 44 are stacked on the translucent insulation substrate 41 in this order. The base insulating film 42 is, for example, an oxide silicon film. The amorphous semiconductor layer 43 is, for example, an amorphous silicon film with a film thickness of 50 nm.

The cap film 44 is made of a light absorptive material which absorbs one portion of the incident light or a translucent material which transmits almost all the incident light. The light absorptive material used for the cap film 44 is, for example, a $SiO_x$ film, where X<2. The above X is preferably in the range of 1.4 to 1.9, and more preferably in the range of 1.4 to 1.8. The $SiO_x$ film is a silicon oxide film having a different composition ratio of Si and O. When the cap film 44 is translucent, it is, for example, the $SiO_2$ film.

The substrate 41 is a translucent insulation substrate such as a glass substrate or a plastic substrate when it is used for display such as liquid crystal. The base insulating film 42 has a function of preventing diffusion of impurity from the substrate 41 and a function of protecting the substrate 41 from heat in the crystallization process. The amorphous silicon film 43 is a semiconductor layer which forms a function element as a thin film transistor, crystallized into large crystal grains and arrayed.

The cap film 44 is an insulating layer which has a thermal insulation effect of preserving for a predetermined time the heat obtained by the amorphous silicon film 43 (semiconductor layer 43) absorbing the incident laser light for crystallization, to grow the large crystal grains. When the cap film 44 is light-absorptive, the cap film 44 itself absorbs one portion of the incident light and generates heat, thereby increasing the above heat preserving effect. The cap film 44 is necessary in order to lengthen the grain length when the amorphous silicon film 43 is crystallized. In these ways, the substrate 21 is producted.

The positioned substrate 21 is mounted on the XYZθ stage 22 at a predetermined position. The XeCl excimer laser oscillator 14 emits a laser light of wavelength with an absorption property favorable to the amorphous silicon layer 43 of the substrate 21 and a pulse laser beam of energy enough to melt the predetermined range of the irradiation region. In the case of the film structure including the light absorptive cap film, the energy density of the laser light is, for example, 0.3 to 0.7 $J/cm^2$ on the substrate 21.

In the case of the film structure including the translucent cap film, it is, for example, 0.5 to 1 $J/cm^2$ on the substrate 21. The pulse duration per one shot is, for example, 30 nanoseconds. The laser light 25 of long beam with the wavelength of 308 nm emitted from the XeCl excimer laser oscillator 14 is divided into diffusion beam by the homogenizer 15 formed by two sets (X direction and Y direction) of small lenses. The homogenizer 15 is an optical component for uniforming the light intensity distribution on the cross section of the laser light coming from the laser oscillator 14.

The first condenser lens 16 concentrates the laser lights of the respective nucleus rays of the beams divided by the homogenizer 15 and it is arranged so as to work together with the second condenser lens 17. The mask 18 is provided on the output optical path of the second condenser lens 17 and the mask 18 shields the non-effective laser light in the peripheral portion. Namely, the nucleus rays of the divided beams are concentrated on the center of the mask 18 by the condenser lens 16 (convex lens #1). As the respective laser beams are a little diffusive, they illuminate the whole surface of the mask 18.

As all the rays coming out through the divided minute regions illuminate all the points on the mask 18, even when the light intensity on the laser irradiation surface has a fluctuation on the plane, the light intensity of the mask 18 becomes uniform. The center rays of the ray group passing through the respective regions of the mask 18, namely, the group of the diffusion rays coming through the pair lenses in the central portion of the homogenizer 15 become parallel to each other by the condenser lens 17 (convex lens #2) near the mask 18. The laser lights of the parallel rays pass the telecentric reducing lens 20 (imaging lens) through the phase shifter 19 and vertically enter the substrate 21 mounted on the XYZθ stage 22.

The group of the rays 25 passing through the same position of the mask 18 concentrates on one point on the surface of the substrate 21, as illustrated in FIG. 1. In other words, the reduced image of the mask 18 is formed on the surface of the substrate 21 with the uniform light intensity. The ray group 25 which illuminates some point on the surface of the substrate 21 is formed by the divided rays including the center ray. The angle made by some ray and the center ray 13 takes the value obtained by multiplying the angle determined by the geometric shape of the homogenizer 15, that is, the angle made by this ray and the center ray on the mask 18 by the magnification of the telecentric lens 20.

The phase shifter 19 phase-modulates the incident laser light 25, to get a light having the light intensity distribution of the inverse peak pattern. As the phase shifter 19, for example, an area modulation type shown in FIGS. 3A and 3B can be used.

The lens 20 is an optical system for projecting the image made by the phase shifter 19 on the surface of the substrate 21. The lens 20 is a lens for reducing the pattern image into the scale from 1/1 to 1/20, for example, 1/5, and it is arranged into a conjugate relation with the surface of the substrate 21. The reducing lens 20 forms the transmitted image of the light intensity distribution having the inverse peak pattern on the surface of the substrate 21.

In the laser annealing according to the projection method, the value obtained by multiplying the period of the pattern of the phase shifter 19 by the magnification of the reducing lens 20 is preferably in the range of 4 to 80 µm. When this value is too large, the crystal grain 1 stops growing in the lateral direction on the way and the whole surface of the irradiation region cannot be filled with the crystal grains 1. On the contrary, when this value is too small, the grain length of the crystal grain 1 becomes short, and it is impossible to expect enlargement of grain size.

The XYZθ stage 22 is designed to be automatically positioned while rotating in the respective axes of XYZ and around the Z axis by θ, according to a program previously stored in a controller. The XYZθ stage 22 can move the substrate 21 step by step to the next irradiation position automatically according to a program previously stored, every time a pulse laser beam is emitted.

In the projection method, the Step & Repeat movement of the substrate 21 is relatively easier according to the XYZθ stage 22 and it is very effective as the process for mass production. The film structure of the substrate 21 in the laser annealing has to include a light absorptive or translucent cap film 44 as the upper layer and an insulating film 42 as the lower layer, in order to keep the heat within the amorphous silicon film 43 when the amorphous silicon film 43 absorbs and melts the incident pulse laser beam upon receipt of it through the cap film 44.

When the cap film 44 is light-absorptive, it is exposed to the incident laser light and absorbs one portion. When it is translucent, it reflects one portion and transmits all the remaining light. In the case of the light absorptive cap film 44, almost all the remaining light is absorbed by the amorphous silicon layer 43. In the case of the translucent cap film 44, one portion of the remaining light is reflected and the other is absorbed by the amorphous silicon layer 43. As the result, the light receiving region of the amorphous silicon layer 43 absorbs and melts the laser light of the light intensity distribution shown in FIG. 3A.

When the pulse laser beam is shielded, though the melting region falls into the temperature decreasing period, the existence of the cap film 44 helps decrease the temperature gradually. In the case of the light absorptive film, its effect is large. In the amorphous silicon layer 43, the light intensity distribution of the inverse peak pattern shown in FIG. 3D indicates that the crystal growth is carried out according to the movement of a crystallization point in the lateral direction, namely while gradually passing from the portion of the minimum light intensity to the crystallization point.

A minimum light intensity portion B that the crystallization point first passes as shown in FIG. 3D is a crystallization start point 3 as shown in FIG. 2A. The distance between the minimum light intensity portion B and the maximum light intensity portion U, that is, a half period T/2 determines the grain length of the crystal grain 1.

In this crystallization process, annealing process is carried out while shifting the irradiation region by moving the XYZθ stage 22 step by step by a predetermined pitch according to the emitting timing of pulse laser beam from the laser oscillator 14. By repeating this annealing process in a predetermined procedure, the irradiation regions of the amorphous silicon layer 43 on the substrate 41 are crystallized one after another. This crystallization process makes it possible to crystallize the amorphous silicon layer 43 on the substrate 41 for a large scaled LCD, for example, with one side exceeding 1 m (1000 mm). Means for shifting the irradiation region has only to shift the laser light and the stage 22 relatively.

Figure 4:
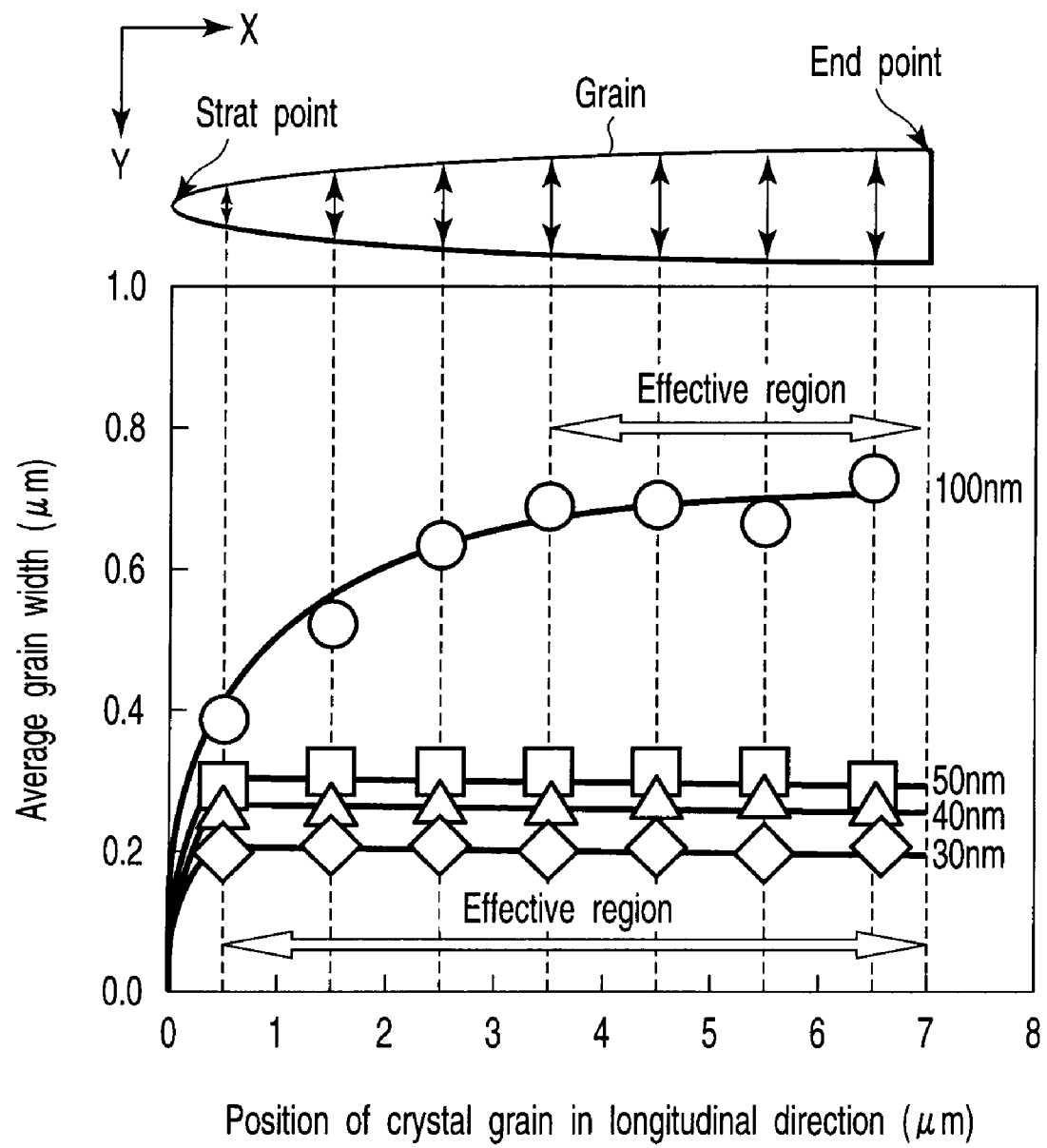
FIG. 4 is a property view showing a relation between a distance from a crystallization start point of a crystal grain and the average grain width when the film thickness of an amorphous silicon film is varied.

Next, the grain array 2 shown in FIG. 2A will be more specifically described. The relation between the distance from the growth start point 3 of the crystal grain 1 and the average grain width, or the relation between the silicon film thickness and the average grain width is shown in FIG. 4. It shows the case where the silicon film thickness is in the range of 100 to 30 nm and the grain length is in the range of 7 to 8 µm.

As apparent from FIG. 4, it is found that according as the film thickness of the amorphous silicon film 43 gets thinner, the average grain width gets narrower, into a grain array 2 of long and slender crystal grains 1 as shown in FIG. 2A. A center region 5 is an amorphous silicom, and a region 3a between the center region 5 and the growth start point 3 is a fine crystals. FIG. 4 indicates that when the film thickness of the amorphous silicon film 43 gets thinner, the start point where the increase of the average grain width shows a saturation property gets closer to the crystal growth start point 3 and that the region capable of forming a channel region C of a TFT 6 described later widens. In short, that the region where the average grain width shows constant is wide means that the TFT 6 free from unevenness in mobility and threshold voltage property can be formed in a wider range of the crystallization region. As illustrated in FIG. 4, the crystal shape can be controlled by the silicon film thickness.

Figure 5A:
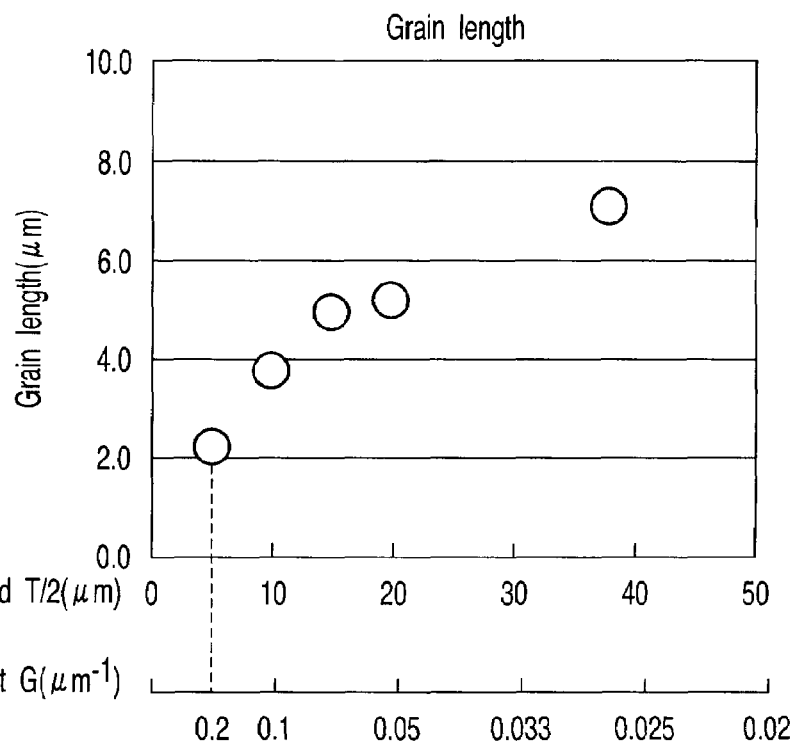
FIG. 5A is a property view showing a relation between the half period of the light intensity distribution and the grain length of crystallized grain array when the film thickness of an amorphous silicon film is 100 nm.
Figure 5B:
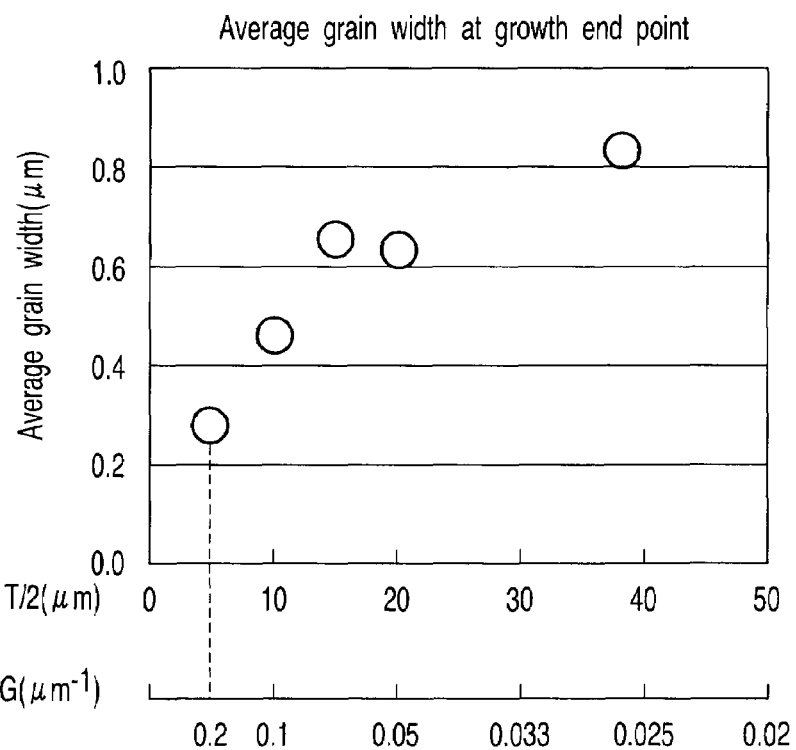
FIG. 5B is a property view showing a relation between the half period of the light intensity distribution and the average grain width at a growth end point when the film thickness of the amorphous silicon film is 100 nm.

When the film thickness of the amorphous silicon film 43 is 100 nm, its grain length and grain width straightly get larger proportionally until the half period (T/2) of 15 µm as shown in FIGS. 5A and 5B, and when the half period further increases, the grain length also gradually increases. The grain length, however, does not grow after the half period of 15 µm. As for the grain length when the film thickness of the amorphous silicon film 43 is 100 nm, the grain length grows larger than 2 µm when the light intensity gradient G is less than 0.2 µm$^{-1}$. The grain width grows larger than 0.2 µm when the light intensity gradient G is less than 0.2 µm$^{-1}$.

Figure 6A:
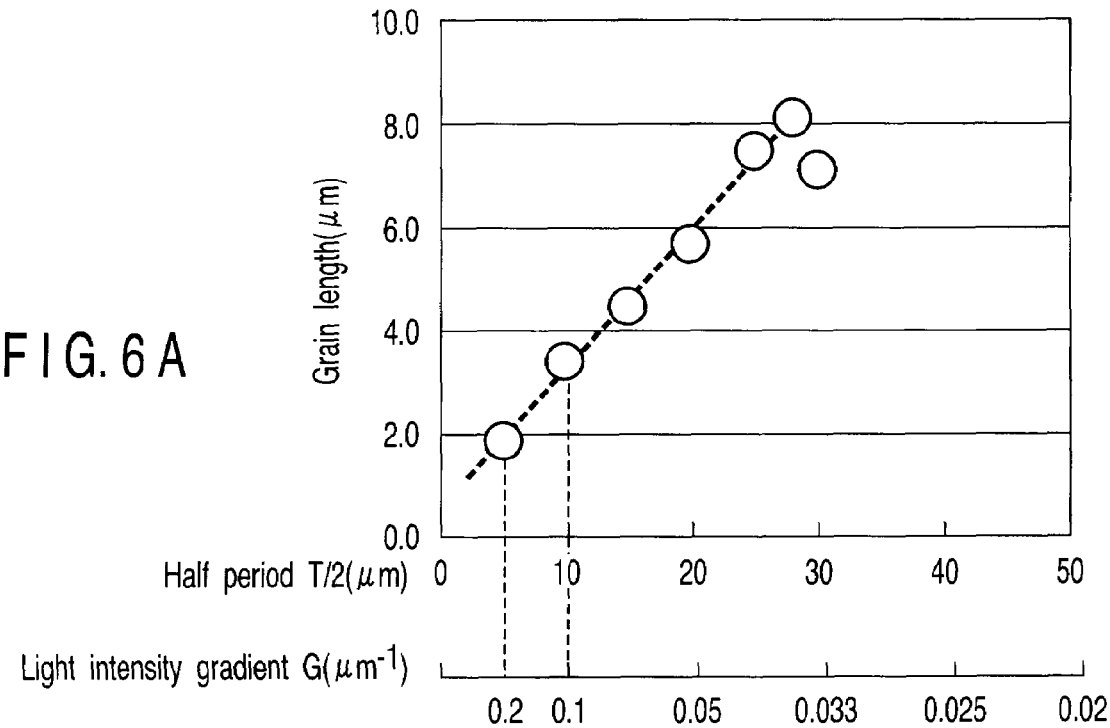
FIG. 6A is a property view showing a relation between the half period of the light intensity distribution and the grain length of crystallized grain array when the film thickness of the amorphous silicon film is 50 nm.
Figure 6B:
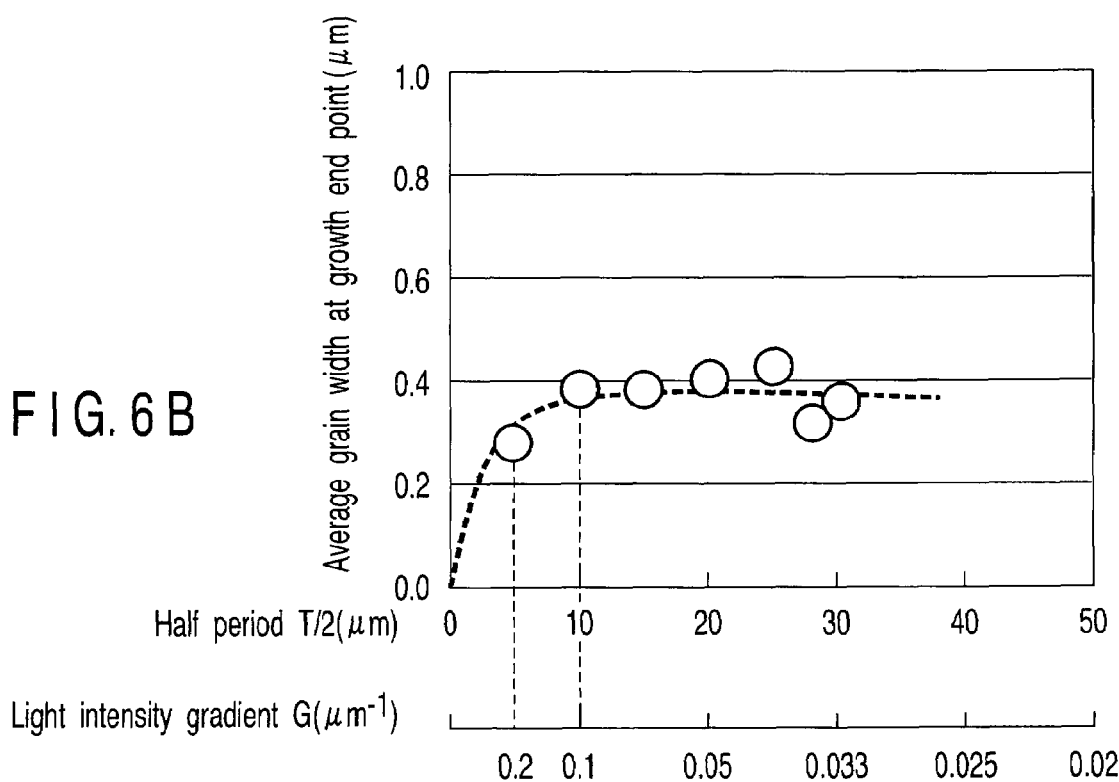
FIG. 6B is a property view showing a relation between the half period of the light intensity distribution and the average grain width at a growth end point when the film thickness of the amorphous silicon film is 50 nm.

On the other hand, when the film thickness of the amorphous silicon film 43 is 50 nm, the grain length straightly grows longer proportionally until the half period (T/2) of 28 µm as shown in FIGS. 6A and 6B. On the contrary, the grain width shows a saturation property at the half period of about 10 µm and larger. The light intensity gradient G shows the characteristics that the grain length straightly increases when it is 0.25 µm$^{-1}$ or less and the grain width shows a saturation property when it is 0.1 µm$^{-1}$ or less.

The results of FIGS. 5A, 5B, 6A, and 6B are obtained when the minimum value of the laser light intensity is 0 and the maximum value is 1 in the light intensity distribution shown in FIG. 3D. An increase of the half period (T/2) means that the light intensity gradient G becomes smaller, in other words, it becomes gradual.

According to FIGS. 5A and 5B, when the film thickness of the amorphous silicon film 43 is 100 nm, it is found that when the half period T/2 of the light intensity distribution becomes larger, in other words, when the light intensity gradient G becomes gradual, the grain length and the average grain width both increase.

According to FIGS. 6A and 6B, when the film thickness of the amorphous silicon film 43 is 50 nm, it is found that when the half period T/2 of the light intensity distribution becomes larger, in other words, when the light intensity gradient G becomes gradual, the grain length increases, while the average grain width gets saturated. Compared with the case where the film thickness of the amorphous silicon film 43 is 100 nm, the grain length is longer and the grain width is saturated, which makes it easier to form an array of long and slender crystal grains as shown in FIG. 2A.

It is found from FIGS. 5A, 5B, 6A, and 6B that the light intensity gradient G as well as the film thickness of the amorphous silicon film 43 is also an important element to determine a crystal shape and that the crystal shape can be controlled by changing the light intensity gradient G.

Figure 7:
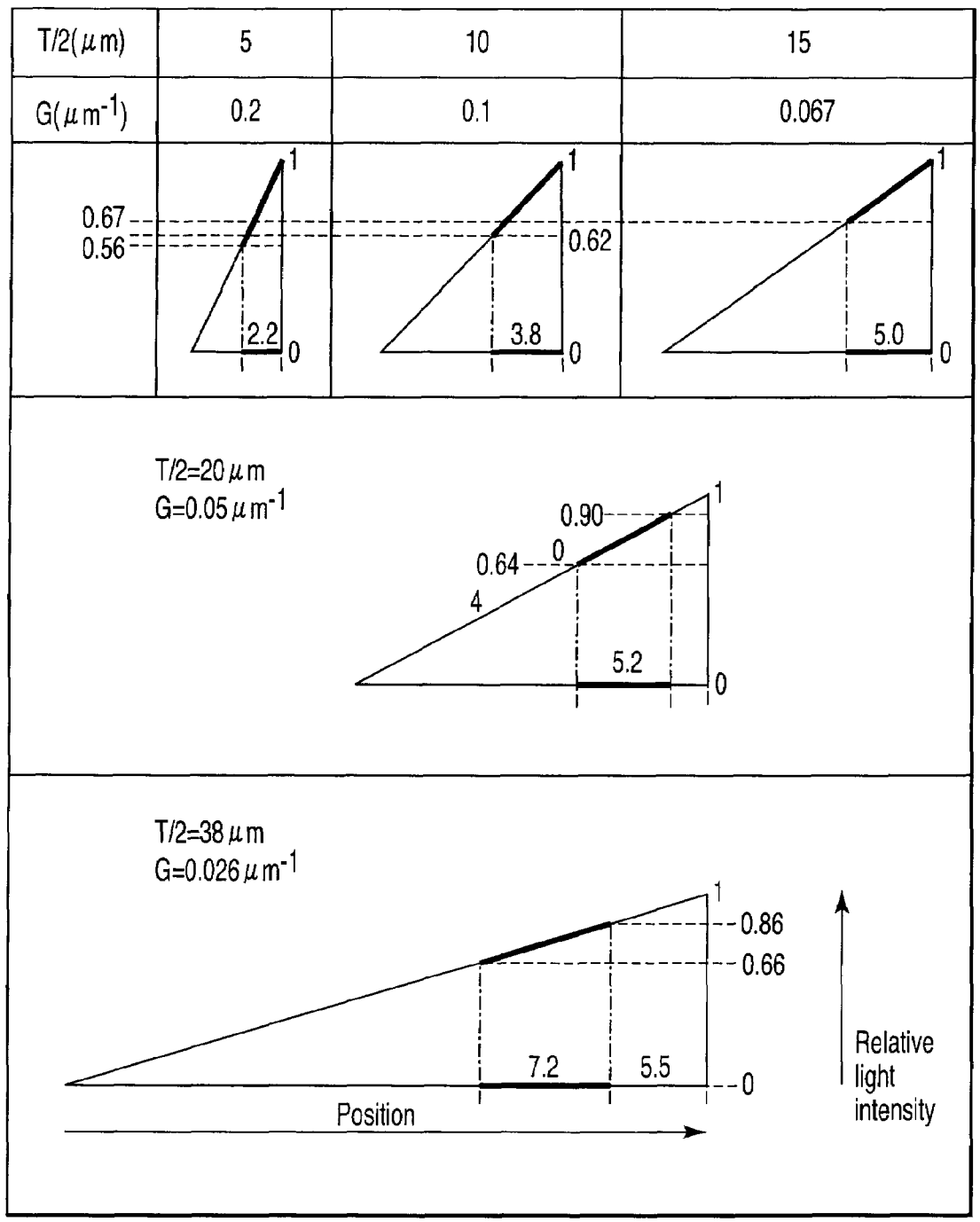
FIG. 7 is a schematic view showing in a table, a relation between a light intensity gradient and a relative light intensity at which a lateral direction growth starts when the film thickness of the amorphous silicon film is 100 nm.
Figure 8:
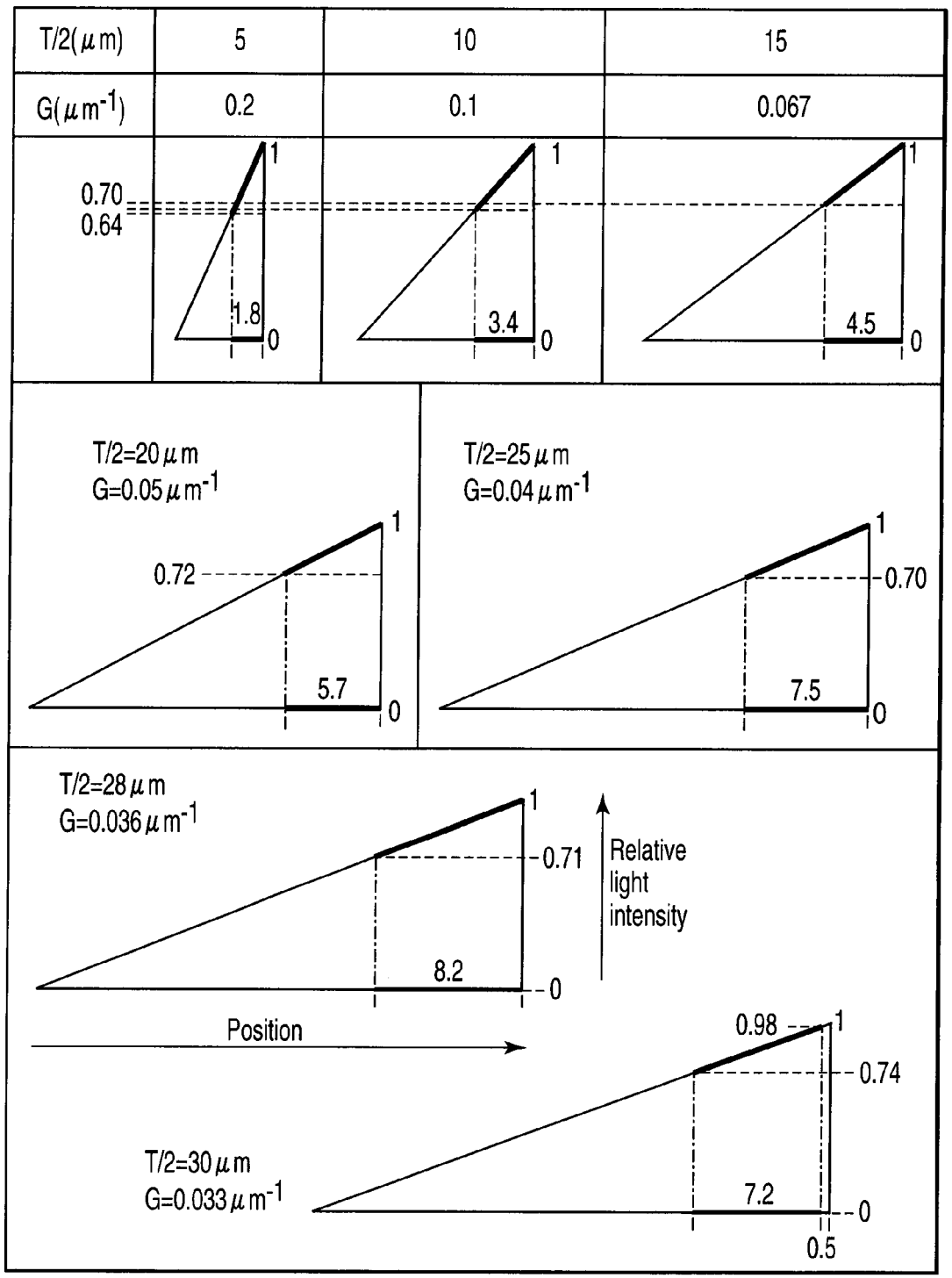
FIG. 8 is a schematic view showing in a table, a relation between a light intensity gradient and a relative light intensity at which a lateral direction growth starts when the film thickness of the amorphous silicon film is 50 nm.

FIGS. 7 and 8 show the relative light intensity at which a growth in a lateral direction starts respectively when the film thickness of the amorphous silicon film 43 is 100 nm and when it is 50 nm. Each shows an aspect of the light intensity distribution for half period, indicating the portion concerned about a growth in a lateral direction by a heavy line, together with the relative intensity and the grain length at which the lateral growth starts. The value of the light intensity gradient G is also indicated together with the half period T/2. Here, the maximum value of the light intensity distribution is an intensity of the light can be incident without generating the laser ablation. Here, the maximum value of the light intensity distribution is defined as a reference value 1.

According to FIG. 7, it is found that when the film thickness of the amorphous silicon film 43 is 100 nm, the relative light intensity at which the lateral growth starts is in the range of 0.56 to 0.67. FIG. 7 indicates that when the light intensity gradient G becomes sharper (the value G becomes larger), the relative light intensity at which the lateral crystal growth starts gets lower.

According to FIG. 8, it is found that when the film thickness of the amorphous silicon film 43 is 50 nm, the relative light intensity at which the lateral growth starts is in the range of 0.64 to 0.74. Compared with the case where the film thickness of the amorphous silicon film 43 is 100 nm, it is found that the relative light intensity at which the lateral growth starts is higher.

According to the results of FIGS. 7 and 8, it is found that the range of the relative light intensity at which the lateral growth starts is determined depending on the condition and the range varies depending on the silicon film thickness and the light intensity gradient. This is the heat current effect in a film surface direction. Namely, in order to form the long and slender crystal grains shown in FIG. 2A with a high filling factor, it is preferable that the minimum value B of the light intensity distribution shown in FIG. 3D is equal to the relative light intensity at which the lateral growth starts under a predetermined condition.

Forming a TFT 6 in a region showing a saturation property as for the average grain width, as shown in FIG. 4, means that electrons or holes moving within the channel region C move in parallel to the crystal grain boundaries 4. The movement of the electrons or the holes in parallel with the crystal grain boundaries 4 enhances the mobility of the TFT 6 since they do not cross the crystal grain boundaries 4. Further, it can reduce unevenness in the mobility property ($\mu_{FE}$) and the threshold voltage property (Vth).

In order to manufacture a TFT 6 of good quality, it is necessary to increase the number of crystal grains in the channel region C which forms one TFT 6. It is found that an increase in the number of crystal grains can similarly reduce the unevenness in the mobility property ($\mu_{FE}$) and the threshold voltage property (Vth) of the TFT 6.

When film thickness of the amorphous silicon film 43 is 50 nm, for example, a starting point of saturation as for the crystal grain width is 0.5 μm from the crystal growth start point 3 in the case of FIG. 4. As shown in FIG. 6A, when the half period T/2 of the light intensity distribution is 28 μm, the grain length of the crystal grain becomes 8 μm. As shown in FIG. 6B, when the half period T/2 of the light intensity distribution is 28 μm, the average grain width of the crystal grain becomes 0.4 μm. This crystal grain presents a long and slender shape extending in one direction and having a narrow width. The long and slender crystal grains 1 are aligned adjacently to each other, hence to form a crystallized grain array 2 as shown in FIG. 2A. Under this condition, it is possible to manufacture a TFT 6 with less unevenness in the mobility property ($\mu_{FE}$) and the threshold voltage property (Vth), in a wider range of the crystallization region. When a crystal grain 1 has the grain length in the range of 2 μm to 15 μm and the grain width in the range of 0.2 to 0.8 μm, a TFT 6 can be manufactured with less unevenness in the mobility property ($\mu_{FE}$) and the threshold voltage property (Vth).

The TFT 6 of this embodiment is formed in such a way that a non-single crystal semiconductor thin film is directly or indirectly provided on the substrate 41, this semiconductor thin film is irradiated with an energy light such as laser light, hence to grow a crystal seed in a lateral direction, to form a long crystal grain 1 extending more in the crystal growth direction than in the width direction, and to provide a crystallized grain array 2 with the crystal grains 1 aligned adjacently to each other in the width direction as shown in FIG. 2A. In this TFT 6, a source region S and a drain region D are provided so that the current flows across a plurality of the crystal grains 1 of the crystallized grain array 2 in the crystal growth direction.

A method of manufacturing a thin film transistor (TFT) 6 will be described more specifically with reference to FIGS. 2A and 2B.

A base insulating film, for example, a $SiO_2$ film 42 is provided on the substrate 41, for example, a glass substrate. A non-single crystal semiconductor film, for example, an amorphous silicon film 43 is provided on the $SiO_2$ film 42. The amorphous silicon film 43 is formed with the film thickness, for example, in the range of 30 nm to 100 nm, in order to form the long and slender crystal grains 1. When the amorphous silicon film 43 becomes thinner than the film thickness of 30 nm, the lateral growth distance becomes shorter and the degree of freedom in the arrangement of the TFT becomes smaller. Further, the process of manufacturing devices becomes difficult. When it becomes thicker than 100 nm, the grain width at the end point of crystallization becomes wider, which disturbs the formation of array 2 consisting of long and slender crystal grains 1.

Next, a crystallization method according to a second embodiment will be described, in which a surface orientation in a crystal growth direction in an irradiation region can be preferentially adjusted at (100) by selecting a light intensity gradient of the light intensity distribution having an inverse peak pattern.

EMBODIMENT 2

A crystallization method according to the second embodiment is to irradiate the non-single crystal semiconductor thin film having the film thickness of from 40 nm to 70 nm both inclusive with a laser light for crystallization having the light intensity gradient G set in the range of 0.02 $\mu m^{-1}$ to 0.04

μm$^{-1}$, hence to preferentially determine the surface orientation of the crystal growth direction of an irradiation region at (100), when the relative light intensity of the maximum value is defined as 1 in the film structure using a light absorptive cap film, in the light intensity distribution having the inverse peak pattern as for the same optical system as that in the crystallization method of the first embodiment.

Further, in the film structure using a translucent cap film, the above method is to preferentially determine the crystal orientation in the crystal growth direction, namely in the grain length direction at (100) by selecting the light intensity gradient G in the range of 0.05 μm$^{-1}$ to 0.25 μm$^{-1}$ and selecting the film thickness in the range of 40 nm to 100 nm.

Figure 9A:
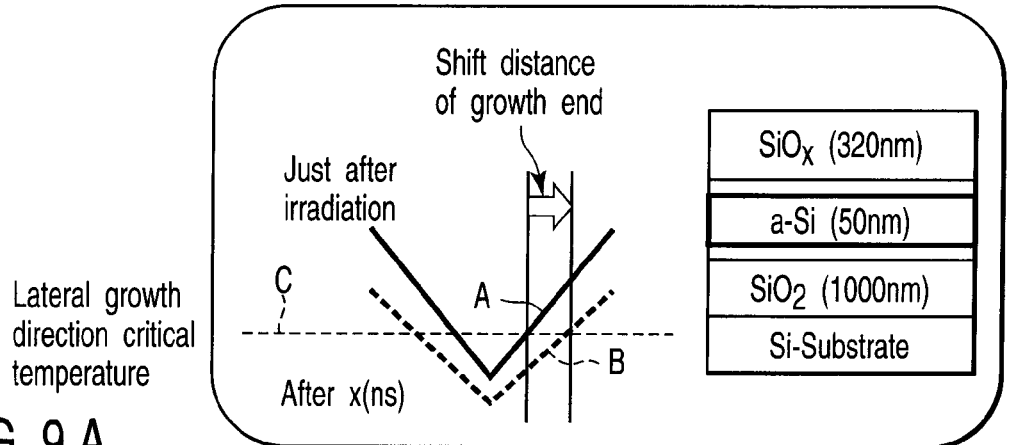
FIG. 9A is a schematic view for use in explaining a change of the light intensity distribution when a cap film is made of a light absorptive material (reference condition)
Figure 9B:
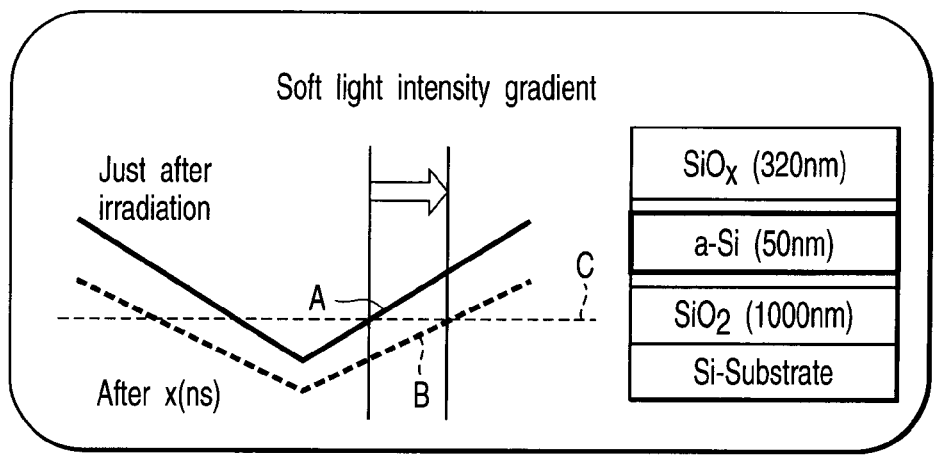
FIG. 9B is a schematic view for use in explaining a change of the light intensity distribution when light intensity gradient is softer than that of the reference condition (experiment condition 1)
Figure 9C:
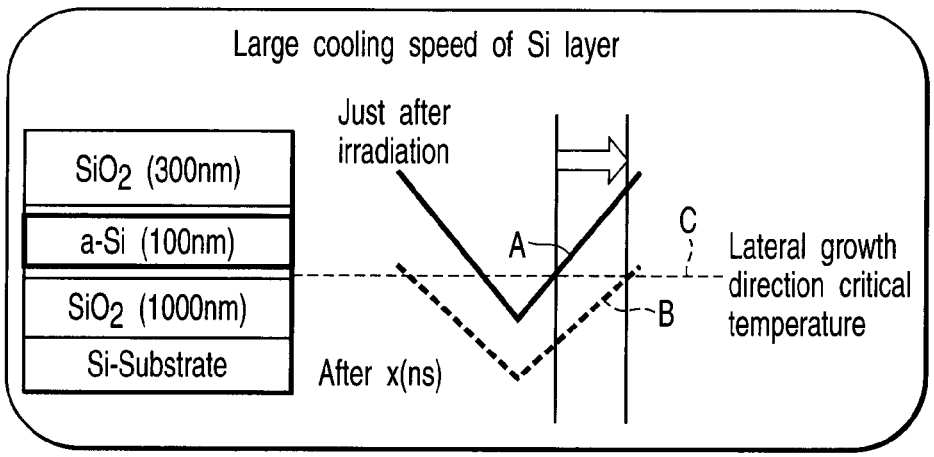
FIG. 9C is a schematic view for use in explaining a change of the light intensity distribution when the cap film is made of a translucent material (experiment condition 2)

An embodiment of the crystallization method for preferentially determining the crystal orientation in the crystal growth direction, namely, in the grain length direction at (100) will be described hereinafter. FIGS. 9A, 9B, and 9C are concept views for preferentially determining the crystal orientation in the crystal growth direction, namely in the grain length direction at (100) when forming the array 2 of the long and slender crystal grains 1 shown in FIG. 2A.

It is known that the growing speed of each crystal surface is, for example, in the order of (100)>(110)>(111), taking a surface of low index as an example. When the crystal structure is a diamond structure like a silicon, the crystal growing speed on the surface (111) that is the densest surface of atom is the lowest, while the crystal growing speed on a rough surface (100) is the highest. Conversely, in a system of crystal growing in one direction, when a laser crystallization condition of speeding up the crystal growth is set so as to be able to neglect the other influence such as a boundary energy between the amorphous silicon layer 43 and the base insulating film 42, it is expected that the crystal orientation in the growth direction is preferentially determined at (100).

FIGS. 9A, 9B, and 9C indicate the V shaped light intensity distribution (namely, temperature distribution) just after a pulse laser beam enters the surface of the substrate by a heavy line and the V shaped temperature distribution after a predetermined x nanosecond (ns) just after shielding of the pulse laser beam by a dotted line. The temperature distribution of V shaped dotted line indicates that the temperature falls down while keeping the V shaped light intensity distribution of the incident light. The temperature falling property of the V shaped dotted line enables a slow crystal growth in the lateral direction owing to the heat preserving effect of the cap film 44 and the base insulating film 42. In FIGS. 9A and 9B, the cap film 44 is made of a light absorptive material SiO$_x$, and in FIG. 9C, it is made of a translucent material SiO$_2$.

FIG. 9A shows a reference condition when the cap film is made of the light absorptive material. FIG. 9B shows an experiment condition 1 with the light intensity gradient G more gradual than that of the reference condition. FIG. 9C shows an experiment condition 2 with the same light intensity gradient G as that of the reference condition and with the cap film 44 of the translucent material SiO$_2$. In FIGS. 9A, 9B, and 9C, a horizontal dotted line C indicates a critical temperature (crystallization end) at which the crystallization regions sequentially grow in a lateral direction during the temperature falling period. In FIGS. 9A, 9B, and 9C, the period indicated by a blank arrow where the temperature distributions A and B cross the horizontal dotted line C shows the growth distance of crystal grain 1 during period of x(ns).

In the temperature distribution after x(ns), the temperature falls down on the whole compared to that just after the irradiation because the amorphous silicon layer 43 cools down after the pulse laser beam is shielded. Because of the heat conduction in the film surface direction of the amorphous silicon film 43, the temperature gradient becomes gradual. The critical temperature C indicates the temperature at which the crystal grain starts growing in a lateral direction and after x nanosecond (ns), it grows laterally from the point A to the point B by the period indicated by the blank arrow in FIGS. 9A, 9B, and 9C. When the light intensity gradient becomes softer compared with the case of the reference condition, provided that the degree of the temperature falling after x(ns) is the same as that of the reference condition, the lateral growth distance becomes longer as shown in FIG. 9B. Namely, the crystal growth speeds up.

When the crystal orientation in the crystal growth direction, namely in the grain length direction is preferentially determined at (100) in the film structure using the light absorptive cap film 44, as described later, the film thickness of the amorphous silicon film 43 is in the range of 40 nm to 70 nm. When it becomes thinner than 40 nm, the effect of decreasing in the film thickness, namely the influence of the boundaries between a semiconductor layer and a base layer becomes larger at a time of crystallization, and the crystal orientation in the grain length direction easily becomes (110) and does not become (100). When it is thicker than 70 nm, the grain width at the crystallization end point is widened, which disturbs the formation of the array of long and slender crystal grains. In short, crystal growth does not occur in one direction and crystal orientation is difficult to determine. Preferably, it is in the range of 50 nm to 60 nm.

In the case of using the translucent cap film 44, the silicon layer 43 is easier to cool down than in the case of using the light absorptive cap film 44, and therefore, the temperature distribution after x(ns) falls down on the whole further than under the reference condition. Accordingly, as illustrated in FIG. 9C, the lateral growth distance sequentially gets longer. Namely, the crystal growing speed becomes larger. In this case, the cooling speed of the silicon layer 43 is greater in the case of using the translucent cap film than in the case of using the light absorptive cap film. Therefore, the crystal growing period becomes shorter in the case of using the translucent cap film, resulting in shortening the grain length.

In the case of the film structure using a translucent cap film, when the crystal orientation in the crystal growth direction, namely in the direction of grain length is preferentially determined at (100), the film thickness of the amorphous silicon film 43 is in the range of 40 nm to 100 nm. When it is thinner than 40 nm, the effect of decreasing in the film thickness, namely the influence of the boundaries between a semiconductor layer and a base layer becomes larger at a time of crystallization, and the crystal orientation in the grain length direction easily becomes (110) and does not become (100). When it is thicker than 100 nm, the grain width at the crystallization end point is widened, which disturbs the formation of the array of long and slender crystal grains. In short, crystal growth does not occur in one direction and crystal orientation is difficult to determine. Preferably, it is in the range of 50 nm to 60 nm.

Figure 10:
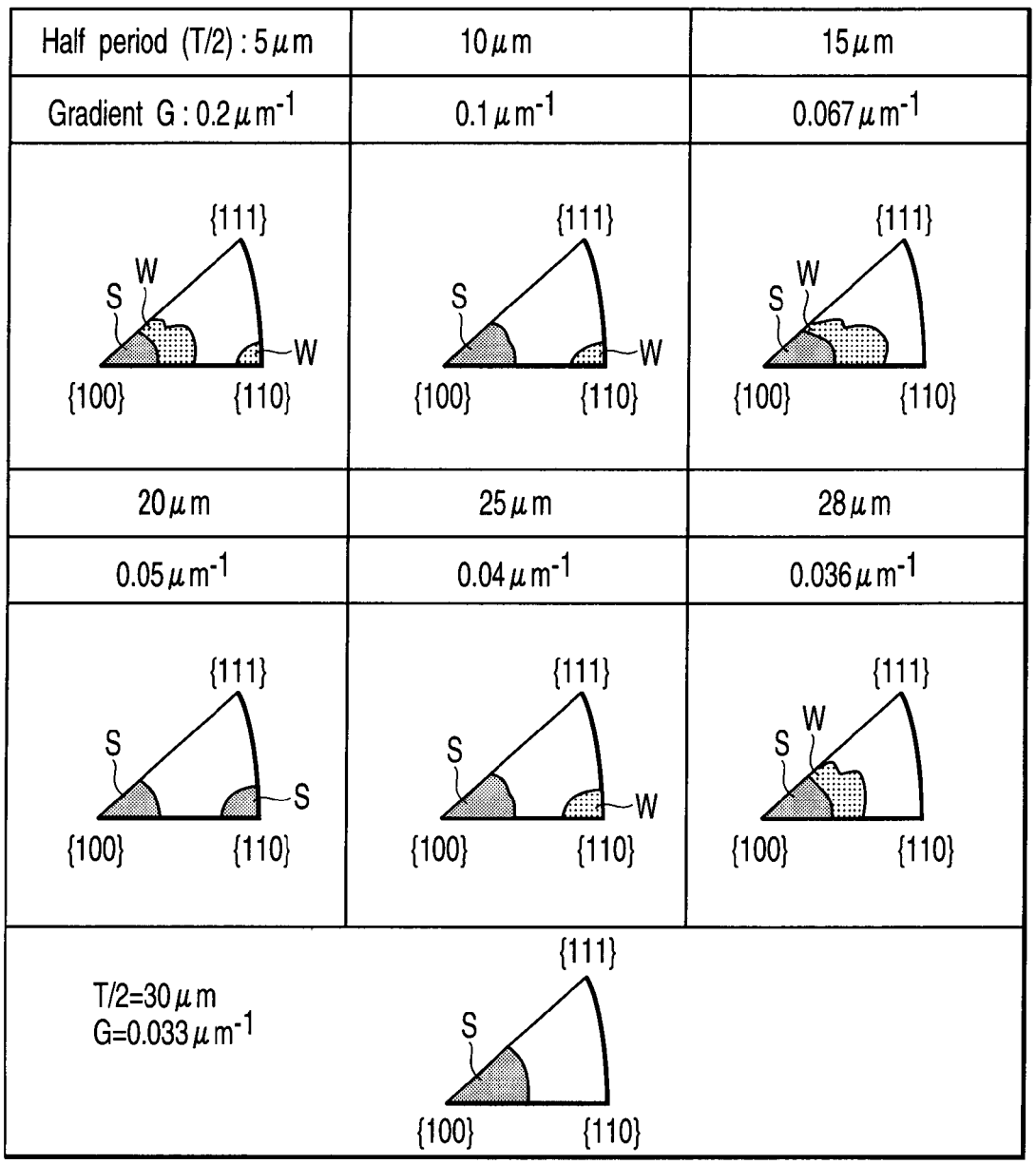
FIG. 10 is an inverse pole figure showing in a table, a relation between the half period of V shaped light intensity distribution and the crystal orientation in a grain length direction of crystallized grain array when the film thickness of the amorphous silicon film is 50 nm.

When the film thickness of the amorphous silicon film 43 is 50 nm, it is found from FIG. 10 that the surface orientation in the grain length direction, namely in the crystal growth direction is preferentially determined at (100) or (110) at any point of the half period T/2, namely in any light intensity gradient. When the half period T/2 becomes larger up to the value of 30 μm and the light intensity gradient becomes gradual, it is found that the surface orientation is determined only at (100). The region S in FIG. 10 indicates a region of strong orientation and the region W indicates a region of weak orientation.

This result means that the crystal growing speed becomes larger and the surface orientation in the growth direction is preferentially determined at (100), by making the light intensity gradient gradual, as illustrated in FIG. 9B (experiment condition 1). Namely, it is found that by controlling the light intensity gradient, the surface orientation in the growth direction can be controlled. Thus, by forming a TFT 6 in the long and slender grain array where the crystal orientation in the growth direction is thus controlled, it is possible to manufacture the TFT 6 with large mobility and less unevenness in the TFT property.

Figure 11:
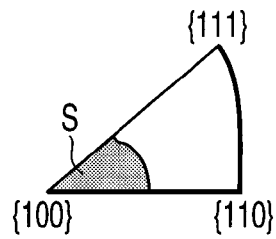
FIG. 11 is an inverse pole figure showing an example of the crystal orientation in the longitudinal direction of the crystallized grain array.

FIG. 11 is an inverse pole figure indicating the crystal orientation in the growth direction in the case of using the translucent $SiO_2$ cap film. The film thickness of the amorphous silicon film 43 is 100 nm and the half period T/2 in the light intensity distribution is 5 μm. The light intensity gradient G is 0.2 μm$^{-1}$. The grain length is 2.7 μm. It shows that the crystal orientation in the growth direction is preferentially determined at (100). This result shows that the crystal growing speed becomes faster by increasing the cooling speed, as illustrated in FIG. 9C (experiment condition 2) and that the surface orientation in the growth direction is preferentially determined at (100). Namely, it is found that the surface orientation in the growth direction can be controlled also by changing a material of the cap film 44. By forming the TFT 6 in a long and slender grain array where the crystal orientation in the growth direction is controlled in these ways, it is possible to form the TFT 6 with a large mobility and a less unevenness in the TFT property. The arrangement of the TFT 6, however, is restricted because the grain length becomes shorter.

On the thin film of the above amorphous silicon film 43, a long and slender crystallized grain array 2 shown in FIG. 2A is formed according to the PMELA method. The crystal grain 1 is longer in the crystal growth direction than in the width direction; its grain length is, for example, in the range of 2 μm to 15 μm and its average grain width is, for example, in the range of 0.2 μm to 0.8 μm. When the grain length is shorter than 2 μm, the degree of freedom in the arrangement of the TFT 6 for enhancing the mobility becomes smaller. When the grain length is longer than 15 μm, defect density of the crystal grains increases and crystallinity gets worse. When the average grain width is narrower than 0.2 μm, influence from the boundary becomes larger, which disturbs the TFT 6 having a higher mobility. When the average grain width is wider than 0.8 μm, it is necessary to widen the channel width of the TFT 6 in order to reduce the influence caused by the unevenness in every crystal grain 1. The surface orientation of the crystal grain 1 in the crystal growth direction, namely in the grain length direction is determined in the range of (100) to (110), or preferentially determined at (100).

As illustrated in FIG. 2A, the crystallized grain array 2 has the crystal grains 1 aligned in the width direction. The TFT 6 is formed in the crystallized grain array 2. The source region S and the drain region D are provided in the TFT 6 so that the electrons and holes move in parallel to the respective boundaries 4. In short, the source region S and the drain region D are formed so that the current (moving direction of hole) flows in the crystal growth direction.

Figure 2B:
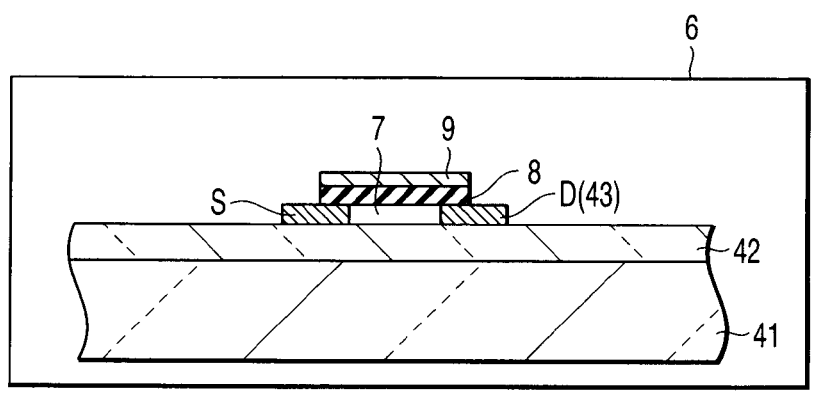
FIG. 2B is a schematic cross-sectional view showing a thin film transistor including the crystallized grain array shown in FIG. 2A.

The channel region C between the source region S and the drain region D is formed across a plurality of, for example, four or five adjacent crystal grains 1, as illustrated in FIG. 2B. In the channel region, the grain width of each of the crystal grains 1 is almost constant at any position of the grain length direction. A gate insulating film 8, for example, a film stack of an oxide film and a $SiO_2$ film is provided on the channel region C formed between the source region S and the drain region D.

A gate electrode 9 is provided on the gate insulating film 8. The TFT 6 is constituted in this manner. In FIG. 2A, a reference numeral 3 shows the crystal growth start position (point).

FIG. 10 shows a relation between the half period T/2 in the light intensity distribution and the crystal orientation in the growth direction when the film thickness of the amorphous silicon film 43 is 50 nm. In FIG. 10, crystal composition under each condition is analyzed according to the Electron Back Scattered Diffraction Pattern (hereinafter, referred to as EBSP) and the results are shown in the inverse pole figure, in order to show each orientation. In the inverse pole figure, the region S indicates a region exhibiting a strong orientation and the region W indicates a region exhibiting a weak orientation.

Through the above crystallization process, it is found that an array of long and slender crystal grains, as shown in FIG. 2A, can be manufactured depending on the crystallization condition and that the crystal orientation in the crystal growth direction, namely in the grain length direction can be controlled in the amorphous silicon film 43.

EMBODIMENT 3

Next, an embodiment of the crystallization method for crystallizing the amorphous silicon film 43 on the substrate 21 by using the laser annealer 11 (crystallization device 40) of FIG. 1 will be described.

Figure 3C:
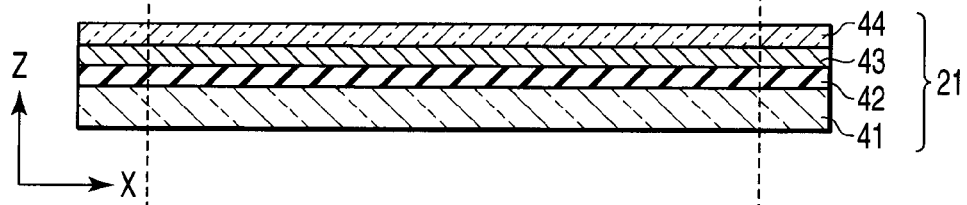
FIG. 3C is a vertical cross-sectional view of a substrate to be processed.
Figure 3D:
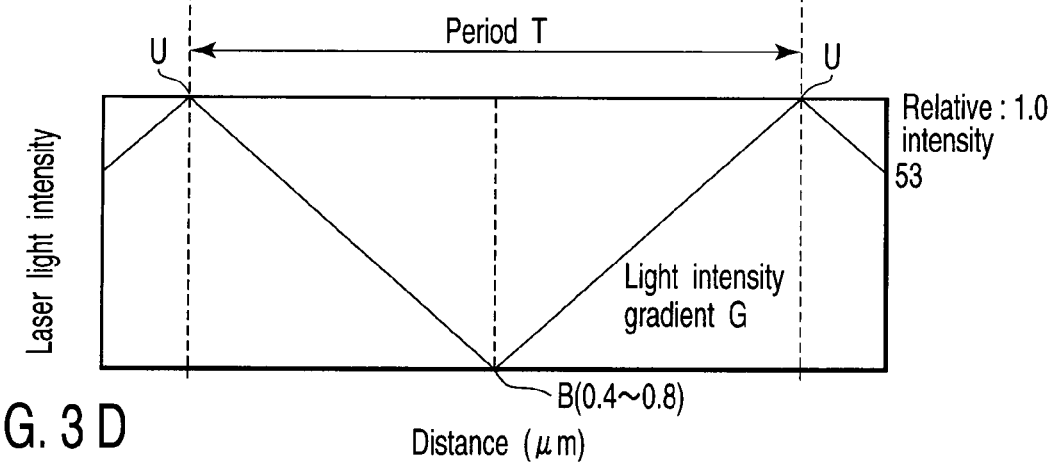
FIG. 3D is a light intensity distribution map of laser light phase-modulated by the phase shifter.

At first, a substrate 21 to be processed in the crystallization process is manufactured. As the crystallization condition, the film structure, as shown in FIG. 3C, is adopted to the substrate 21, in which a base insulating film 42, a non-single crystal semiconductor film, and a cap film 44 are sequentially formed on a substrate 41, for example, according to the plasma CVD method. As the cap film 44 on the uppermost layer on the side of the incident light, a $SiO_X$ film (e.g. film thickness 370 nm) or a film stack of it and $SiO_2$ (e.g. film thickness 30 nm), if necessary, is used. As the non-single crystal semiconductor film, an amorphous silicon film 43 (a-Si layer) is used. As the base insulating film 42, a $SiO_2$ film (film thickness 1000 nm) or a film stack of it and $Si_3N_4$ (film thickness 1000 nm), if necessary, is used. As the substrate 41, a glass substrate is used. The amorphous silicon film 43 of the substrate 21 is manufactured with the film thickness of 100 nm.

The $SiO_X$ film is a silicon oxide film different from a silicon dioxide film in the composition of Si and O, with the extinction coefficient k=0.01, for example. In the $SiO_X$ film, x<2.0, and ideally, it can change the optical gap from Si (to 1.1 eV: x=0) to $SiO_2$ (to 9 eV: x=2). The wavelength of a laser, for example, an excimer laser used for crystallization can control the absorption coefficient to the degree of 0 to $10^5$ cm$^{-1}$. Especially, when x is in the range of $1.4 \leq x \leq 1.9$, a favorable crystal growth is observed.

The laser annealer 11 of FIG. 1 is an optical system in which the phase shifter 19 is positioned near the mask 18 and the image of the phase shifter 19 is formed on an incident surface of the substrate 21. Namely, the laser annealer 11 is an optical system which projects the image of the phase shifter 19 on the surface of the substrate 21 cooperatively. The pattern of the phase shifter 19 is converted (reduced) on the substrate 21 in the scale of 1/5 by a 1/5 telecentric reducing lens 20.

The phase shifter 19 has the dot pattern steps (high step 52 and low step 51) of various areas arranged as illustrate in FIG. 3A. The laser light 25 illuminates the substrate 21 through the phase shifter 19 having the pattern shown in FIG. 3A. This laser light 25 is phase-modulated by the phase shifter 19, and forms a periodically V shaped light intensity distribution having an inverse peak pattern, as shown in FIG. 3D. FIG. 3D shows one period of the light intensity distribution in an enlarged way.

The phase shifter 19 periodically changes the arrangement of the dot pattern so that the period of the V shaped light intensity distribution may be 10, 20, 30, 40, and 76 μm. The phase difference of the phase shifter 19 is 180°, and when the relative intensity of the maximum value in the light intensity distribution is 1, the relative intensity of the minimum value is 0 (zero). The light intensity gradient G accordingly becomes 0.2, 0.1, 0.067, 0.05, and 0.026 μm$^{-1}$. Here, the phase shifter 19 means an optical element of space intensity modulation for modulating the phase of the laser light. The laser fluence for illuminating the amorphous silicon film (a.Si layer) 43 for crystallization is 0.6 J/cm$^2$, for example.

The laser source 14 is an XeCl excimer laser with the wavelength, for example, of 308 nm and with the pulse duration per one shot of 30 nanoseconds. A fluence means the scale indicating the energy density of the laser light for crystallization, that is, the energy amount per unit area, and more specifically, it means the average light intensity of the laser light measured in the light source or the irradiation region (irradiation field).

In the crystallized grain array 2 manufactured as shown in FIG. 2A, the crystal grain 1 with the grain length shown in FIG. 5A and the average grain width shown in FIG. 5B is obtained. When the film thickness of the amorphous silicon film 43 is 100 nm, it is possible to control the crystal shape, as shown in FIGS. 5A and 5B, by changing the light intensity gradient G.

EMBODIMENT 4

A substrate 21, in which as a cap film 44 on the uppermost layer on the side of the incident light, a film stack of SiO$_X$ (film thickness 370 nm) and SiO$_2$ (film thickness 30 nm) is used. As a non-single crystal semiconductor film, an amorphous silicon film 43 (a-Si layer) is used. As a base insulating film 42, a film stack of SiO$_2$ (film thickness 1000 nm) and Si$_3$N$_4$ (film thickness 1000 nm) is used. As a substrate 41, a glass substrate is used. The amorphous silicon film 43 is manufactured with the film thickness of 50 nm.

The laser annealer 11 of FIG. 1 is an optical system in which a phase shifter 19 is positioned near a mask 18 and the image of the phase shifter 19 is formed on an incident surface of the substrate 21. Namely, the laser annealer 11 is an optical system which projects the image of the phase shifter 19 on the surface of the substrate 21 cooperatively. The pattern of the phase shifter 19 is converted (reduced) on the substrate 21 in the scale of 1/5 by a 1/5 telecentric reducing lens 20.

The phase shifter 19 has the dot pattern steps of various areas arranged as illustrate in FIG. 3A. The laser light 25 illuminates the substrate 21 through the phase shifter 19 having the pattern shown in FIG. 3A. This laser light 25 is phase-modulated by the phase shifter 19, and forms a periodically V shaped light intensity distribution having an inverse peak pattern, as shown in FIG. 3D. FIG. 3D shows one period of the light intensity distribution in an enlarged way.

The phase shifter 19 periodically changes the arrangement of the dot pattern so that the period of the V shaped light intensity distribution may be 10, 20, 30, 40, 50, 56, and 60 μm. The phase difference of the phase shifter 19 is 180° and when the relative intensity of the maximum value in the light intensity distribution is 1, the relative intensity of the minimum value is 0. The light intensity gradient G accordingly becomes 0.2, 0.1, 0.067, 0.05, 0.04, 0.036, and 0.033 μm$^{-1}$. The laser fluence for illuminating the amorphous silicon film (a.Si layer) 43 for crystallization is 0.5 J/cm$^2$.

The laser source 14 is an XeCl excimer laser with the wavelength, for example, of 308 nm and with the pulse duration per one shot of 30 nanoseconds. In the crystallized grain array 2 thus manufactured as shown in FIG. 2, the crystal grain 1 with the grain length shown in FIG. 6A and the average grain width shown in FIG. 6B is obtained. Also when the film thickness of the amorphous silicon film 43 is 50 nm, it is possible to control the crystal shape, as shown in FIGS. 6A and 6B, by changing the light intensity gradient G.

EMBODIMENT 5

A crystallization device is an optical system of the projection method in FIG. 1, similarly to the embodiment 4. The phase shifter 19 has a dot pattern arranged so that the period of the V shaped light intensity distribution shown in FIG. 3D may be 16 μm. A step depth t is 133 nm and the phase difference is 78°. The maximum value of the intensity in the periodically V shaped light intensity distribution formed here is 1 in the relative value and the minimum value is 0.6 in the relative value. The light intensity gradient G becomes 0.05 μm$^{-1}$.

As the crystallization condition, the film structure of the substrate 21 is formed so that the cap film 44 is a film stack of SiO$_X$(370 nm)/SiO$_2$ (30 nm); the amorphous silicon film 43 is a.Si (50 nm); the base insulating film 42 is a film stack of SiO$_2$ (film thickness 1000 nm)/Si$_3$N$_4$ (film thickness 1000 nm); and the substrate 41 is a glass substrate. The irradiation fluence of the laser light is 0.5 J/cm$^2$. The laser source 14 of this laser light is an XeCl excimer laser with the wavelength of 308 nm and with the pulse duration per one shot of 30 nanoseconds, similarly to the embodiment 1.

In the crystallized grain array obtained through this crystallization process, the crystal grain 1 has the grain length of 8 μm and the average grain width of 0.4 μm, and the long and slender grain array 2 shown in FIG. 2A can be manufactured over the whole surface of the irradiation region. The surface orientation in the grain length direction, namely in the crystal growth direction is preferentially determined at (100) or (110).

EMBODIMENT 6

A crystallization device is an optical system of the projection method in FIG. 1, similarly to the embodiment 3. A phase shifter 19 has a dot pattern arranged so that the period of the V shaped light intensity distribution may be 10 μm. A step depth t is 154 nm and the phase difference is 90°. The maximum value of the intensity in the periodically V shaped light intensity distribution formed here is 1 in the relative value and the minimum value is 0.5 in the relative value. The light intensity gradient G becomes 0.1 μm$^{-1}$.

As the crystallization condition, the film structure of the substrate 21 is formed so that the cap film 44 is a film stack of SiO$_X$(370 nm)/SiO$_2$ (30 nm); the amorphous silicon film 43 is a.Si (100 nm); the base insulating film 42 is a film stack of SiO$_2$ (film thickness 1000 nm)/Si$_3$N$_4$ (film thickness 1000 nm); and the substrate 41 is a glass substrate. The irradiation fluence of the laser light is 0.6 J/cm$^2$. The laser source 14 of this laser light is an XeCl excimer laser with the wavelength of 308 nm and with the pulse duration per one shot of 30 nanoseconds, similarly to the embodiment 1.

In the crystallized grain array 2 obtained through this crystallization process, the crystal grain 1 has the grain length of 5 μm and the average grain width of 0.7 μm, and the long and slender grain array 2 as shown in FIG. 2A can be manufactured over the whole surface of the irradiation region. The surface orientation in the grain length direction, namely in the crystal growth direction is preferentially determined at (100) or (110).

EMBODIMENT 7

An embodiment 7 uses an optical system of the projection method in FIG. 1, similarly to the above embodiments, and it uses the phase shifter 19 having a dot pattern of periodically different measurement, as shown in FIG. 3A. The phase shifter 19 has a pattern arranged so that the period of the V shaped light intensity distribution may be 16 μm. A step depth t is 113 nm and the phase difference is 66°. The maximum value of the intensity in the light intensity distribution formed here is 1 in the relative value and the minimum value is 0.7 in the relative value. The light intensity gradient G becomes 0.0375 μm$^{-1}$.

As the crystallization condition, the film structure of the substrate 21 is formed so that the cap film 44 is a film stack of $SiO_X$ (370 nm)/$SiO_2$ (30 nm); the amorphous silicon film 43 is a.Si (50 nm); the base insulating film 42 is a film stack of $SiO_2$ (film thickness 1000 nm)/$Si_3N_4$ (film thickness 1000 nm); and the substrate 41 is a glass substrate. The irradiation fluence of the laser light is 0.5 J/cm$^2$. The laser source 14 of this laser light is an XeCl excimer laser with the wavelength of 308 nm and with the pulse duration per one shot of 30 nanoseconds, similarly to the embodiment 1.

In the crystallized grain array 2 obtained through this crystallization process, the crystal grain 1 has the grain length of 8 μm and the average grain width of 0.4 μm, and the long and slender grain array 2 shown in FIG. 2A can be manufactured over the whole surface of the irradiation region. Further, in the array 2 of the crystal grains 1, the surface orientation in the grain length direction, namely in the crystal growth direction may be preferentially determined at (100).

EMBODIMENT 8

An embodiment 8 uses an optical system of the projection method in FIG. 1, similarly to the above embodiments, and it uses the phase shifter 19 having a dot pattern of periodically different measurement, as shown in FIG. 3A. The phase shifter 19 has a pattern arranged so that the period of the V shaped light intensity distribution may be 6 μm. A step depth t is 141 nm and the phase difference is 102°. The maximum value of the intensity in the light intensity distribution formed here is 1 in the relative value and the minimum value is 0.4 in the relative value. The light intensity gradient G becomes 0.2 μm$^{-1}$.

As the crystallization condition, the film structure of the substrate 21 is formed so that the cap film 44 is $SiO_2$ (300 nm); the amorphous silicon film 43 is a.Si (100 nm); the base insulating film 42 is a film stack of $SiO_2$ (film thickness 1000 nm)/$Si_3N_4$ (film thickness 1000 nm); and the substrate 41 is a glass substrate. The irradiation fluence of the laser light is 1 J/cm$^2$. The laser source 14 of this laser light is a KrF excimer laser with the wavelength of 248 nm and with the pulse duration per one shot of 20 nanoseconds.

In the crystallized grain array 2 obtained through this crystallization process, the crystal grain 1 has the grain length of 3 μm and the average grain width of 0.4 μm, and the long and slender grain array 2 shown in FIG. 2A can be manufactured over the whole surface of the irradiation region. Further, in the array 2 of the crystal grains 1, the surface orientation in the grain length direction, namely in the crystal growth direction may be preferentially determined at (100). Though the crystallization method according to this embodiment needs a higher laser fluence and the length of the crystallized grain array 2 becomes shorter than those in the embodiments 3 to 7, the surface orientation in the growth direction can be aligned similarly to the embodiment 7.

EMBODIMENT 9

An embodiment of forming a TFT 6 on the crystallization semiconductor film manufactured according to the above embodiments will be described referring to FIGS. 12A, 12B, 12C, and 12D. This embodiment will be described in the case where the invention is applied to the TFT 6, for example, an N-channel TFT. The invention is not restricted to the N-channel TFT but it may be applied to a P-channel type in the substantially same way only by changing the impurity seed (dopant seed). In this embodiment, a method of manufacturing a bottom gate TFT will be described.

Figure 12A:
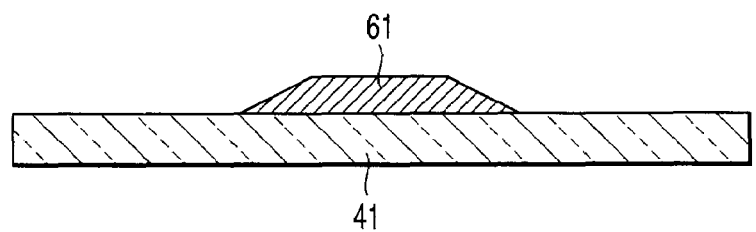
FIGS. 12A, 12B, 12C, and 12D are cross-sectional views of the substrates showing the respective processes in manufacturing a bottom gate TFT according to the method of manufacturing a thin film transistor of the invention.

As illustrated in FIG. 12A, a material for gate electrode, for example, at least one of Al, Ta, Mo, W, Cr, and Cu or an alloyed film of these elements with the film thickness of 100 to 300 nm is formed on an insulation substrate 41 such as a glass plate, and patterning is performed on this metal film to be processed into a bottom gate electrode 61.

Figure 12B:
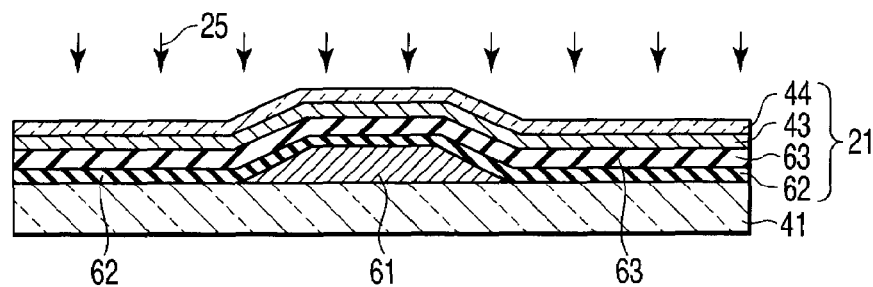

As illustrated in FIG. 12B, gate insulating films 62 and 63 are formed on the gate electrode 61 and the exposed insulation substrate 41. The gate insulating films 62 and 63 are formed into a double layer structure of, for example, nitride film ($SiN_x$) and oxide film ($SiO_2$). The gate nitride film of the gate insulating film 62 can be formed, for example, by using a mixture of $SiH_4$ gas and $NH_3$ gas as a material gas, according to the plasma CVD method (PE-CVD method). Here, the nitride film may be formed according to the atmospheric pressure CVD or the low-pressure CVD, instead of the plasma CVD.

The film thickness of the nitride film is, for example, 50 nm. On the nitride film, an oxide film is formed with the film thickness of, for example, 200 nm as the gate insulating film 63. On this oxide film, a non-single crystal film, for example, an amorphous silicon film 43 is continuously formed with the film thickness of 40 nm to 100 nm. Further, on the amorphous silicon film 43, a cap film 44 made of, for example, $SiO_2/SiO_x$ or $SiO_2$ is formed; in the case of a film stack, for example, the film thickness of $SiO_2$ is 30 nm and the film thickness of $SiO_x$ is 420 nm, and in the case of $SiO_2$, it is formed with the film thickness of 100 to 300 nm. The gate insulating films 62 and 63 of double layer structure, the amorphous silicon film 43, and the cap film 44 are continuously formed without going out from a vacuum system of a film forming chamber (without being exposed to the atmosphere).

In the above film formation process, in the case of using the plasma CVD method, it is heated for 2 hours in the nitride atmosphere of 550° C. for dehydrogenation annealing, so that the hydrogen included in the amorphous silicon film 43 can be released from the amorphous silicon film 43. According to this process, the substrate 21 to be processed for crystallization is manufactured.

The amorphous semiconductor thin film 43 of the substrate 21 is processed for crystallization. The crystallization process is carried out, for example, by using the laser annealer 11 of FIG. 1. According to the methods shown in the above embodiments 1 to 6, the cap film 44 is irradiated with the laser light 25, to crystallize the irradiation region of the amorphous semiconductor thin film 43.

As the laser light 25, an excimer laser beam can be used. After the irradiation region for the laser light 25 is fixed, it is irradiated in accordance with the focus of the laser light 25 so that the periodical pattern of the phase shifter 19 can be transferred there, and the irradiation region is divided from a position to another position not to overlap the positions, and repeatedly irradiated with every one shot, hence to crystallize a predetermined area within the irradiation region. This forms a polycrystal semiconductor thin film 65 with a predetermined region of the amorphous semiconductor thin film 43 crystallized.

This time, the cap insulating film 44 on the surface is etched according to the etching, hence to expose the surface of the amorphous semiconductor thin film 43 where the crystallization region is formed. As mentioned above, on the crystallized surface of the amorphous semiconductor thin film 43, the crystallized grain array 2 including the crystal grains 1 longer in the crystal growth direction than in the width direction, as shown in FIG. 2, is formed. Further, the surface orientation in the crystal growth direction of the crystal grain 1 may be preferentially determined at (100).

Figure 12C:
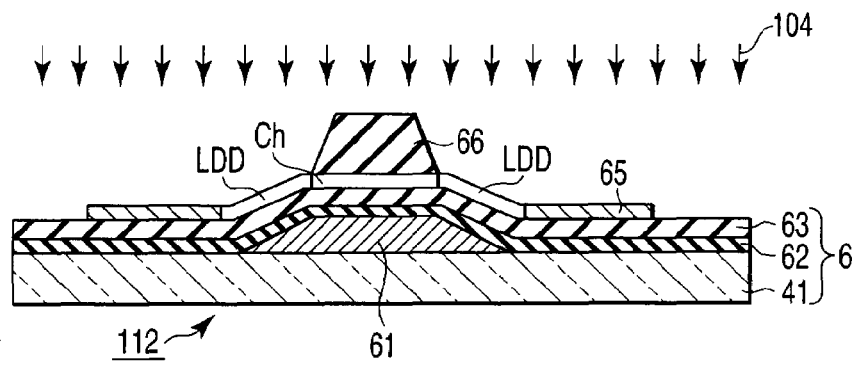

As illustrated in FIG. 12C, ion implantation in order to get a desired Vth is carried out depending on necessity, for the purpose of controlling the threshold voltage Vth of the TFT 6. In the embodiment, ion is implanted so that the dose amount of boron B+ may be about $5 \times 10^{11}$ to $4 \times 10^{12}/cm^2$. In this Vth ion implantation, ion beam accelerated with 10 KeV is used.

Then, a $SiO_2$ film with the film thickness of, for example, about 100 nm to 300 nm is formed on the polycrystal semiconductor thin film 65 crystallized in the prior process according to the plasma CVD method. In this embodiment, the $SiO_2$ is deposited with a silane gas $SH_4$ and an oxygen gas plasma-decomposed. The, thus formed $SiO_2$ film is processed into a stopper film 66 after the patterning into a predetermined shape.

In this case, the stopper film 66 is patterned so as to be adjusted to the gate electrode 61 according to the backside exposure technique. The portion of the polycrystal semiconductor thin film 65 positioned just under the stopper film 66 is protected as a channel region Ch. As mentioned above, the B+ ion is previously implanted with a comparatively little dose in the channel region Ch according to the ion implantation for obtaining a high threshold voltage Vth.

Then, impurity (for example, P+ ion) is implanted in the semiconductor thin film 65 through ion doping with the stopper film 66 used as the mask, hence to form LDD regions. The dose amount at this time is, for example, $5 \times 10^{12}$ to $1 \times 10^{13}/cm^2$ and the acceleration voltage is, for example, 10 KeV.

After patterning a photoresist so as to cover the stopper film 66 and the LDD regions on its both sides, this is used as the mask and impurity (for example, P+ion) is implanted with high concentration, to form a source region S and a drain region D. For example, ion doping (ion shower) may be used for the impurity implantation. This is to implant the impurity with acceleration in the electric field not through the mass separation, and in this embodiment, impurity is implanted with the dose amount of about $1 \times 10^{15}/cm^2$, to form the source region S and the drain region D. The acceleration voltage of the ion implantation is, for example, 10 KeV.

Although it is not illustrated, when forming a P-channel TFT, after the region of the N-channel TFT is covered with the photoresist and the impurity is changed from the P+ ion to the B+ ion, ion doping may be performed with the dose amount of about $1 \times 10^{15}/cm^2$. Here, the impurity may be implanted using a mass separation typed ion implantation device.

Thereafter, through an RTA (rapid thermal annealing) 104, the impurity implanted in the polycrystal semiconductor thin film 65 is activated. Depending on the case, excimer laser annealing (ELA) using an excimer layer may be performed.

Then, unnecessary portions of the semiconductor thin film 65 and the stopper film 66 are simultaneously patterned, to separate the TFT in every element region.

Figure 12D:
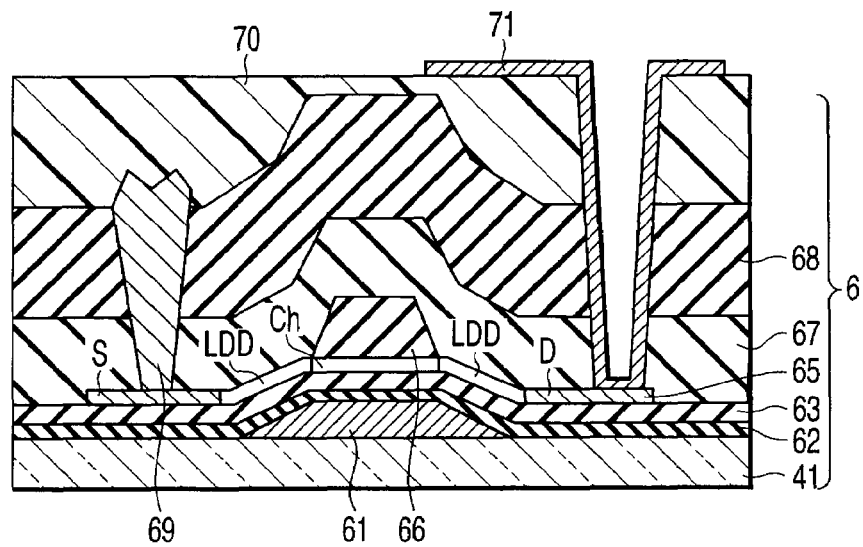

Finally, as illustrated in FIG. 12D, a $SiO_2$ film with the thickness of about 100 to 200 nm is formed as an interlayer insulating film 67. After forming the interlayer insulating film 67, a $SiN_x$ film is formed with the thickness of about 200 to 400 nm according to the plasma CVD method as a passivation film 68. Here, it is heated for 1 hour in the atmosphere of nitride gas or forming gas, or in the vacuum atmosphere at a temperature of 350 to 400° C., hence to scatter the hydrogen atoms included in the interlayer insulating film 67 into the semiconductor thin film 65.

Then, a contact hole for forming a source S electrode is opened and an electrode material layer of Mo or Al is sputtered with the thickness of 100 to 200 nm. Next, the electrode material layer is patterned into a predetermined shape and processed into a wiring electrode 69. After depositing a planarizing layer 70 made of acrylic resin with the thickness of 1 μm, a contact hole for drain D electrode is opened. After sputtering a transparent conductive film made of ITO on the planarizing layer 70, it is patterned into a predetermined shape and processed into a pixel electrode 71. Thus, a TFT 112 is manufactured.

EMBODIMENT 10

Figure 13A:
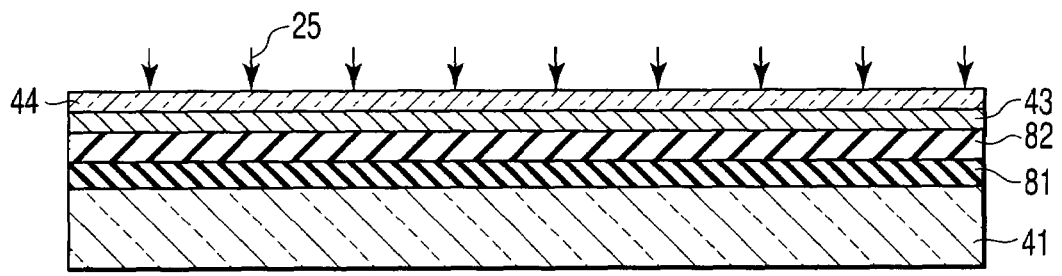
FIGS. 13A, 13B, and 13C are cross-sectional views of the substrates showing the respective processes in manufacturing a top gate TFT according to the method of manufacturing a thin film transistor of the invention.

An embodiment in which the crystallization semiconductor film manufactured in the above embodiments is used in order to manufacture a top gate TFT, will be described with reference to FIG. 13. At first, as illustrated in FIG. 13A, two layers of base films 81 and 82 that become a buffer layer are continuously formed on an insulation substrate 41 according to the plasma CVD method.

The base film 81 in the first layer is made of a $SiN_X$ film (X<2) and its film thickness is in the range of 100 to 1000 nm. The base film 82 in the second layer is made of a $SiO_2$ film and its film thickness is similarly in the range of 100 nm to 1000 nm. A non-single crystal semiconductor thin film 43 formed by the amorphous silicon with the film thickness of 40 to 100 nm is formed on the base film 82 made of the $SiO_2$ film according to the plasma CVD method or the LPCVD method.

Further, a cap film 44 made of $SiO_2/SiO_x$ or $SiO_2$ is formed on the non-single crystal semiconductor thin film 43; when it is a film stack of $SiO_2/SiO_x$, $SiO_2$ with the film thickness of, for example, 30 nm and $SiO_x$ with the film thickness of 320 nm are formed in this order, while when it is a $SiO_2$ film, it is formed with the film thickness of 100 to 300 nm. When the plasma CVD method is used in order to form the non-single crystal semiconductor thin film 43 made of amorphous silicon, it is annealed for about 1 hour in the nitride atmosphere at a temperature of 400 to 450° C. in order to desorb the hydrogen of the film.

According to the crystallization method in the above embodiments 1 to 6, the amorphous semiconductor thin film 43 is crystallized. After the irradiation region for the laser light 25 is adjusted, it is irradiated in accordance with the focus of the laser light 25 so that the periodical pattern of the phase shifter 19 can be transferred there, and the irradiation region is deviated from a position to another position not to overlap the positions, to be repeatedly irradiated with every one shot, hence to crystallize a predetermined area within the amorphous semiconductor thin film 43.

Then, the cap film 44 is etched according to the etching. Here, depending on necessity, ion implantation in order to get a higher threshold voltage Vth previously is carried out similarly to the above embodiment, and the B+ ion with the dose amount of $5 \times 10^{11}$ to $4 \times 10^{12}/cm^2$ is implanted in the semiconductor thin film 43. The acceleration voltage in this case is about 10 KeV.

Figure 13B:
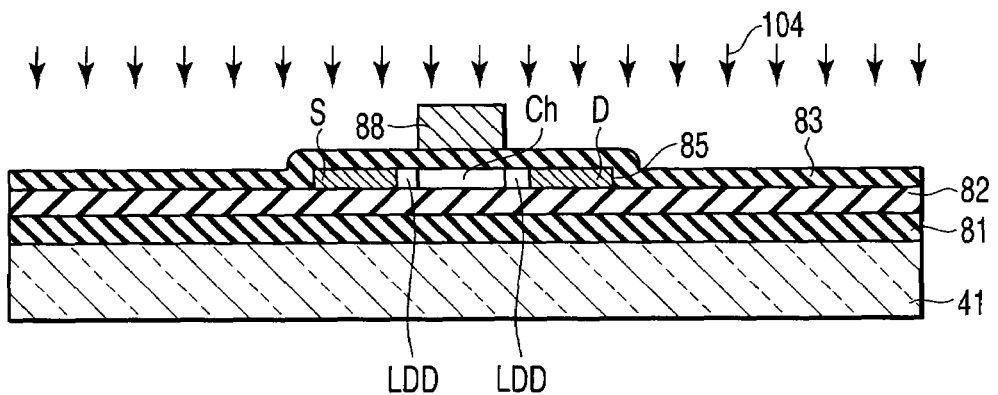

As illustrated in FIG. 13B, a crystallized silicon semiconductor thin film 85 is patterned in a shape of island. On this film, $SiO_2$ is formed with the thickness of 100 to 400 nm as a gate insulating film 83 according to the plasma CVD method, the atmospheric pressure CVD method, the low-pressure CVD method, the ECR-CVD method, the sputtering or the like. In this embodiment, the thickness of the gate insulating film 83 is 100 nm.

Then, Al, Ti, Mo, W, or Ta-doped polycrystalline silicon or an alloy of these elements is formed with the thickness of 200 to 800 nm on the gate insulating film 83, patterned into a predetermined shape, and processed as a gate electrode 88.

The P+ ion is implanted in the crystallization semiconductor thin film 85 according to the ion implantation using mass separation, to form the LDD regions. This ion implantation is performed on the whole insulation substrate 1 with the gate electrode 88 as a mask. The dose amount is $6 \times 10^{12}$ to $5 \times 10^{13}/cm^2$. The acceleration voltage is, for example, 90 KeV. The channel region Ch positioned just under the gate electrode 88 is protected and the B+ ion previously implanted through the Vth ion implantation is kept as it is.

After the ion implantation into the LDD regions, a resist pattern is formed so as to cover the gate electrode 88 and its surrounding, the P+ ion is implanted with high concentration through the ion shower doping method of mass non-separate type, hence to form a source region S and a drain region D. In this case, the dose amount is, for example, about $1 \times 10^{15}/cm^2$. The acceleration voltage is, for example, 90 KeV. A $PH_3$ gas of 20% hydrogen dilution is used as the doping gas.

In the case of forming a CMOS circuit, after a resist pattern for a P-channel TFT is formed, the doping gas is switched to $B_2H_6/H_2$ gas of 5 to 20%, ion may be implanted with the dose amount of $1 \times 10^{15}$ to $3 \times 10^{15}/cm^2$ and the acceleration voltage of, for example, 90 KeV. A mass separation typed ion implanter may be used in order to form the source region S and the drain region D.

Thereafter, the dopant implanted in the crystallization semiconductor thin film 85 is activated. This activation may be performed by the RTA 104 using an ultraviolet lamp, in the same way as in the above embodiment 4.

Figure 13C:
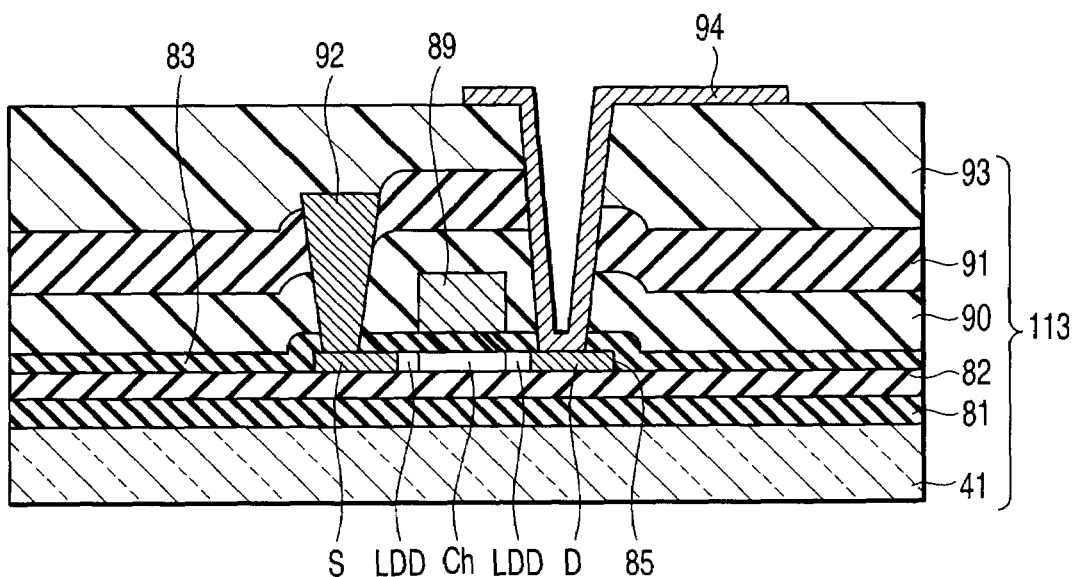

Finally, as illustrated in FIG. 13C, an interlayer insulating film 90 made of PSG is formed so as to cover a gate electrode 89. After the interlayer insulating film 90 is formed, $SiN_x$ is deposited with the thickness of about 200 to 400 nm according to the plasma CVD method, to form a passivation film 91.

At this stage, it is annealed for 1 hour in the atmosphere of nitride gas at a temperature of 350° C., to scatter the hydrogen included in the interlayer insulating film 91, inside the semiconductor thin film 85. Then, a contact hole is opened. Further, after Al—Si and the like is formed on the passivation film 91 through sputtering, it is patterned into a predetermined shape and processed into a wiring electrode 92.

After depositing a planarizing layer 93 made of acrylic resin with the thickness of about 1 μm, a contact hole is opened there. On the planarizing layer 93, a transparent conductive film made of ITO is sputtered, patterned into a predetermined shape and processed into a pixel electrode 94.

The thin film transistor or the semiconductor device shown in FIG. 13C crystallizes the non-single crystal semiconductor thin film 43 in the same way as described in the thin film transistor or the semiconductor device shown in FIG. 12D. The thin film transistor or the semiconductor device of the top gate structure according to the embodiment 10 is different from that of the bottom gate structure according to the embodiment 9 in that crystallization is performed before the pattern of the gate electrode 89 is formed and therefore, latitude as for the shrinkage of the insulation substrate made of glass is larger than that of the semiconductor device of the bottom gate structure. Therefore, the crystallization process can be performed by using a laser irradiation device of larger output. Thus, the TFT 113 is manufactured.

The relation between the mobility in the channel region of the TFT and the crystallized surface (orientation surface) forming the channel region is found in FIG. 14. FIG. 14 shows the source region in the formed TFT as S and the drain region as D and the direction of the current between S and D is indicated by an arrow.

The property indicated in the above means the mobility property of the TFT when the amorphous silicon film is irradiated with a laser light to grow the crystal grains in a lateral direction and the TFT 6 is formed in the crystallization region in the crystal growth direction of <110>. When the crystal orientation on the surface of the channel region coming into contact with the gate insulating film of the TFT is (001) to (112), the mobility $\mu_{FE}$ is highest, that is, 685 to 500 (cm²/Vs). When the crystal orientation on the surface of the channel region is (110), the mobility $\mu_{FE}$ is 450 to 300 (cm²/Vs). When the surface of the channel region is (111), the mobility $\mu_{FE}$ is 300 to 230 (cm²/Vs).

When the crystal growth direction is <100>, the mobility property at a time of forming the TFT in the crystallization region is as follows. When the crystal orientation on the surface of the channel region is (001), the mobility $\mu_{FE}$ is 500 (cm²/Vs). When the crystal orientation on the surface of the channel region is (010), the mobility $\mu_{FE}$ is 346 (cm²/Vs).

It is found from the data that when the crystal growth direction is <100>, the mobility $\mu_{FE}$ can be restrained in the range of 346 to 500 (cm²/Vs) and that a TFT of high mobility can be manufactured.

EMBODIMENT 11

Figure 15:
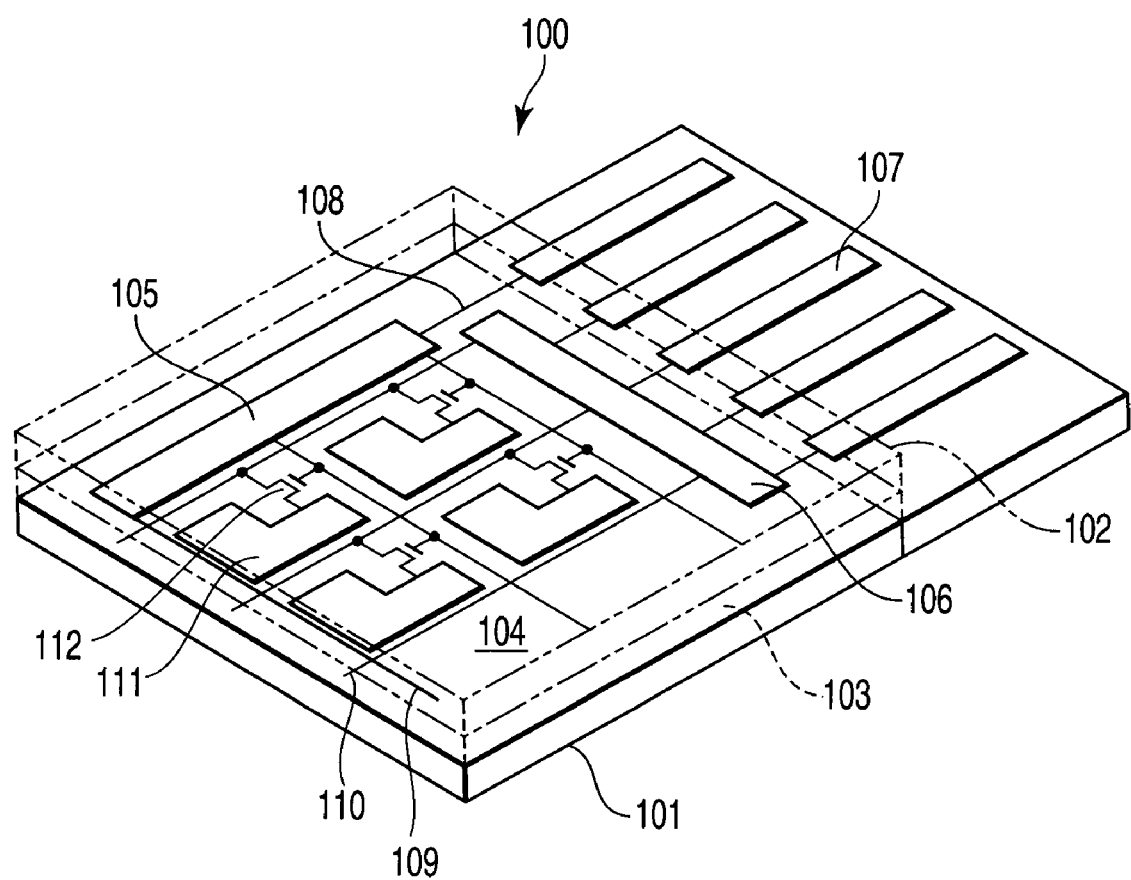
FIG. 15 is a schematic perspective view showing a display.

An embodiment in which the invention is applied to an active matrix display using the TFT according to the embodiment 9 or the embodiment 10 will be described with reference to FIG. 15. A display 100 has a panel structure including a pair of insulation substrates 101 and 102 and an electric optical material 103 intervening therebetween. A liquid crystal material is widely used as the electric optical material 103. A pixel array portion 104 and a driving circuit are formed integrally in the lower insulation substrate 101. The driving circuit includes a vertical driving circuit 105 and a horizontal driving circuit 106.

A terminal portion 107 for external connection is formed on the upper peripheral end of the insulation substrate 101. The terminal portion 107 is connected to the vertical driving circuit 105 and the horizontal driving circuit 106 through a wiring 108. A gate wiring 109 in row and a signal wiring 110 in column are formed in the pixel array portion 104. A pixel electrode 111 and a TFT 112 (or 113) which drives this electrode are formed in each intersection of the both wirings 109 and 110.

Gate electrodes 61 and 89 of the TFT 112 (or 113) are connected to the corresponding gate wiring 109, the drain region D is connected to the corresponding pixel electrode 111, and the source region S is connected to the corresponding signal wiring 110. The gate wiring 109 is connected to the vertical driving circuit 105, while the signal wiring 110 is connected to the horizontal driving circuit 106.

The TFT 112 (or 113) which drives the pixel electrode 111 in a switched way and the TFT included in the vertical driving circuit 105 and the horizontal driving circuit 106 are manufactured according to the embodiments of the invention, and their mobility is higher than that of the conventional TFT. Therefore, not only the driving circuit but also the processor with higher performance can be integrally formed.

As mentioned above, according to the embodiments, it is possible to obtain a TFT with high mobility and with less unevenness in the mobility and the threshold voltage property.

Since the invention enables a TFT with high mobility and with less unevenness in the mobility and the threshold voltage property, it is possible to remarkably improve the performance of a low temperature polysilicon TFT used for a display in various kinds of mobile devices represented by a cellular phone and it contributes to a good performance of the whole product device itself.

According to the invention, it is possible to obtain a TFT with high mobility and with less unevenness in the mobility and the threshold voltage property.

What is claimed is:

1. A crystallization method comprising:
   (i) directly or through a base insulating film forming a non-single crystal semiconductor thin film on a substrate;
   (ii) forming an insulating film on the non-single crystal semiconductor thin film;
   (iii) irradiating the substrate with a laser light having a light intensity distribution of a plurality of inverse peak patterns continuous on an irradiation region of the insulating film;
   (iv) forming a crystal grain array, in which each crystal grain crystallized in a longer shape in a crystal growth direction than in a width direction is aligned adjacently in the width direction, on the non-single crystal semiconductor thin film; and
   (v) selecting a period T of the light intensity distribution in the range between 4 μm and 80 μm inclusive and controlling a light intensity gradient G.

2. A crystallization method comprising:
   (a) directly or through a base insulating film forming a non-single crystal semiconductor thin film on a substrate;
   (b) forming an insulating film on the non-single crystal semiconductor thin film;
   (c) irradiating the substrate with a laser light under such a condition that a light intensity distribution of the laser light has a plurality of inverse peak patterns continuous on an irradiation surface of the insulating film and, when a relative light intensity of the maximum value in the light intensity distribution of the laser light is defined as 1, a light intensity gradient G is selected in the range of 0.02 μm-1 to 0.25 μm-1; and
   (d) forming a crystal grain array, in which each crystal grain crystallized in a longer shape in a crystal growth direction than in a width direction is aligned adjacently in the width direction, on the non-single crystal semiconductor thin film.

3. The method according to claim 2, wherein
   when the relative light intensity of the maximum value in the light intensity distribution is 1, the relative light intensity of the minimum value is in the range of 0.4 to 0.8.

4. The method according to claim 2, wherein
   the period T of the light intensity distribution is in the range of 4 μm to 80 μm.

5. A method of manufacturing a thin film transistor, comprising:
   (a) directly or through a base insulating film forming a non-single crystal semiconductor thin film on a substrate;
   (b) forming an insulating film on the non-single crystal semiconductor thin film;
   (c) irradiating the substrate with a laser light under such a condition that a light intensity distribution of the laser light has a plurality of inverse peak patterns continuous on an irradiation surface of the insulating film and, when a relative light intensity of the maximum value in the light intensity distribution of the laser light is defined as 1, a light intensity gradient G is selected in the range of 0.02 μm-1 to 0.25 μm-1;
   (d) forming a crystal grain array, in which each crystal grain crystallized in a longer shape in a crystal growth direction than in a width direction is aligned adjacently in the width direction, on the non-single crystal semiconductor thin film, and
   (e) forming a circuit so that current flows in the crystal growth direction of the crystal grains.

* * * * *